United States Patent [19]

Bigelow et al.

[11] Patent Number: 5,370,912
[45] Date of Patent: Dec. 6, 1994

[54] DIAMOND FILM DEPOSITION WITH A MICROWAVE PLASMA

[75] Inventors: Louis K. Bigelow, Salt Lake City; James T. Hoggins, Sandy; Deborah Gunderson; Cristan Ellison, both of Salt Lake City, Utah

[73] Assignee: Norton Company, Worcester, Mass.

[21] Appl. No.: 94,908

[22] Filed: Jul. 20, 1993

Related U.S. Application Data

[63] Continuation of Ser. No. 265,182, Oct. 31, 1988, abandoned.

[51] Int. Cl.$^5$ .................................................. B05D 3/06
[52] U.S. Cl. .................................. 427/575; 427/294; 427/299; 427/314; 427/577; 427/595
[58] Field of Search ............... 427/575, 294, 299, 314, 427/577, 595

[56] References Cited

U.S. PATENT DOCUMENTS

| | | | |
|---|---|---|---|
| 4,434,188 | 2/1984 | Kamo et al. | 427/39 |
| 4,507,588 | 3/1985 | Asmussen et al. | 315/39 |
| 4,585,668 | 4/1986 | Asmussen et al. | 427/38 |
| 4,591,662 | 5/1986 | Legros et al. | 179/2 DP |
| 4,630,566 | 12/1986 | Asmussen et al. | 118/501 |

OTHER PUBLICATIONS

Experimental Aspects Of The Microwave Activated Plasma CVD of Diamond Films At MRL, P. K. Bachmann, The Diamond and Related Materials Consortium Newsletter, 1, Jun. 1987.

*Primary Examiner*—Bernard Pianalto
*Attorney, Agent, or Firm*—Volker R. Ulbrich; Kevin McMahon

[57] ABSTRACT

A method for depositing diamond film on a substrate utilizing a tuneable microwave cavity with an adjustable height and antenna and an electrically insulated chamber comprises the steps of decreasing the pressure within the chamber, creating a plasma including hydrogen gas within the chamber, tuning the cavity by varying its height and the depth of insertion of the antenna to minimize reflected power and properly position the plasma on the substrate, injecting a hydrocarbon gas into the chamber, and maintaining the plasma for a sufficient time for diamond film of the desired thickness to be deposited.

35 Claims, 23 Drawing Sheets

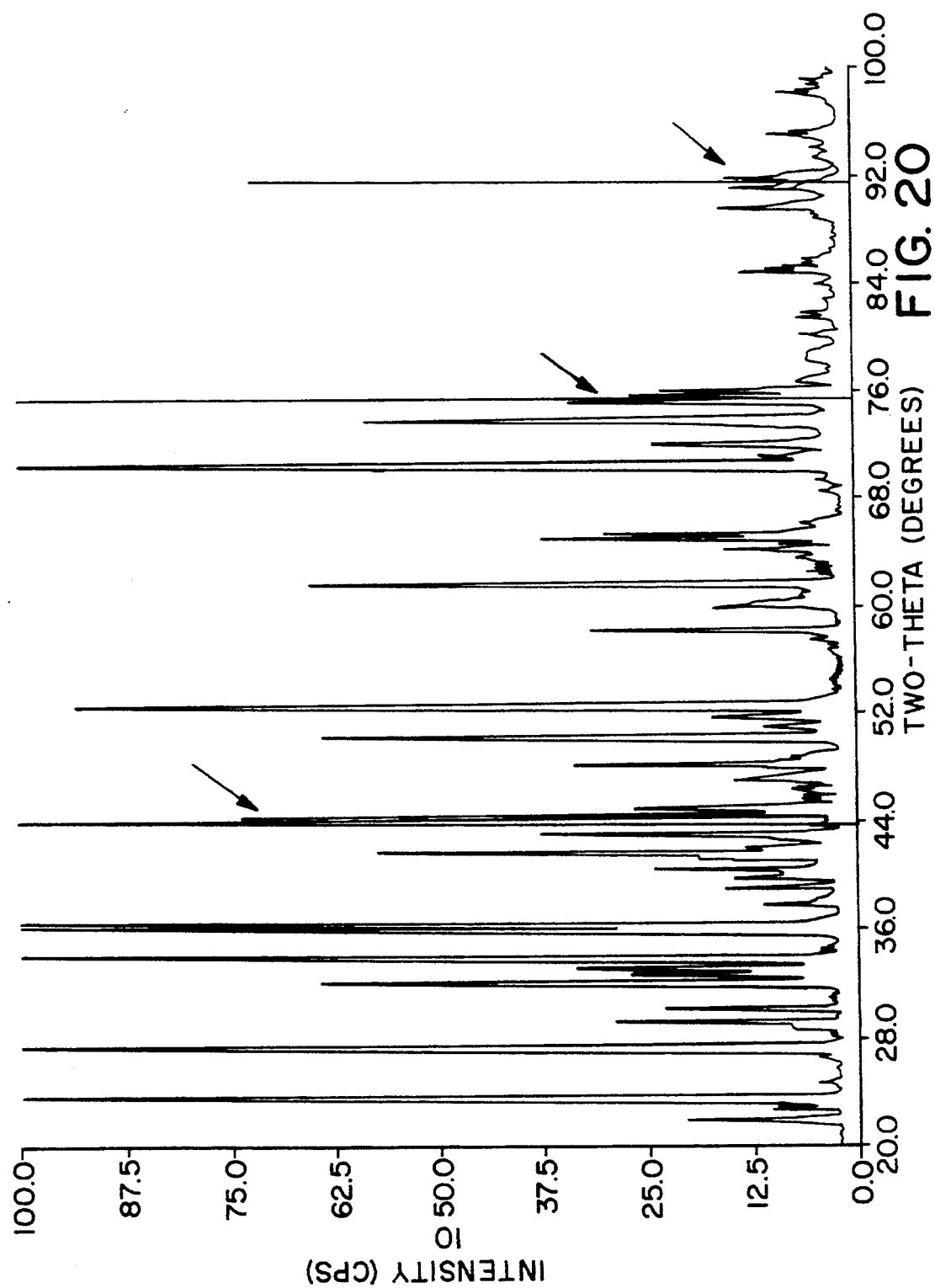

DIAMOND FILM DEPOSITION WITH A MICROWAVE PLASMA

This is a continuation of copending application(s) Ser. No. 07/265,182 filed on Oct. 31, 1988, abandoned.

FIELD OF THE INVENTION

A method for depositing diamond film on a substrate and, more particularly, for depositing diamond from an isolated microwave plasma generated within a tuneable microwave cavity with an adjustable height and antenna.

BACKGROUND OF THE INVENTION

Diamond's superior properties, such as its hardness, high electrical resistivity, high thermal conductivity, optical transparency, low coefficient of friction and chemical inertness, make it advantageous for use in a wide variety of applications. A limitation on the use of diamond, however, has been the difficulty to bond diamond products to supporting structures, or to apply the diamond in the shape required by a particular application. Deposited diamond film has the potential to overcome these limitations. In electronics, possible uses of deposited diamond film include high power, high temperature semiconductors, or high heat conductivity PC boards for silicon integrated circuits. In cutting tools, diamond film can be used on drill bit cutters, bonded abrasives, or diamond grit, for example. Diamond film can be used to protect spectral or infrared windows in radomes. Diamond film can also be particularly useful with lead bond tools, or thermodes, which are used to apply heat to attach electrical leads onto semiconductor circuits.

The process of diamond film deposition is not completely understood. It is known, however, that diamond film can be grown at temperatures and pressures below the high pressure diamond forming region, typically between 40–80 kbars and 1,200° C.–2,000° C., from a vapor phase at low pressure, even though at equilibrium graphite is the most thermodynamically stable crystal form of carbon. To grow diamond film from a vapor under conditions where the graphitic crystal is preferred, it appears that carbon atoms on the substrate surface must be maintained in their $sp^3$ bonding state. Carbon atoms bonded by $sp^3$ bonds yield tetrahedral molecules which can form diamond crystals. Graphite is characterized by unsaturated $sp^2$ bonding.

It has been found that the presence of atomic hydrogen suppresses graphite formation, probably by bonding with unsaturated carbon—carbon bonds. The reaction between hydrogen and the unsaturated carbon molecules breaks the sp or $sp^2$ bonds.

Sufficient energy must be provided to produce reactive hydrogen atoms in the gas phase. Various methods have been used to energize mixtures of hydrogen and hydrocarbon gasses for diamond deposition. Diamond film has been grown on various materials by methods such as ion beam deposition, r.f. assisted chemical vapor deposition ("CVD"), and microwave assisted CVD. However, a reliable method for applying diamond film of adequate quality, at a sufficient rate, which can be used for the commercial production of a wide variety of diamond film products, has been elusive.

In U.S. Pat. No. 4,434,188, to Kamo, et al., a microwave is used to energize a vapor including hydrogen and a hydrocarbon gas and to heat the substrate to be coated. Kamo discloses a method for synthesizing diamond by plasma chemical vapor deposition wherein a microwave plasma of hydrogen gas is first generated, a substrate is placed into the plasma to be heated to between 300° C.–1,300° C. and a hydrocarbon is introduced into the plasma to be deposited and thermally decomposed on the substrate. Kamo states that the thermal energy decomposing the hydrocarbon must be sufficient to produce $sp^3$ bonding between carbon atoms. A microwave oscillator generates an electrodeless discharge in an open tube chamber at reduced pressure to energize the plasma. The substrate is placed on a platform and positioned in the chamber so that it lies within the plasma. The substrate can be heated by the plasma, or a heater. A frequency of 300 MHz or above is used to generate the plasma.

In the "Diamond and Related Materials Consortium Newsletter" ("DRMC"), Vol. 1, No. 1, June 1987, on page 3, a similar open tube microwave plasma apparatus is described. An adjustable platform is included to better position the substrate. A moveable plunger or short circuit acts as a microwave reflector, increasing the power absorbed by the plasma and reducing the power reflected back to the oscillator. The system includes stub tuners for minimizing reflected power.

As discussed in the newsletter at pages 4–5, there are many drawbacks to such a system. For example, an asymmetrical plasma is formed at low pressure. While not stating the pressure level where this becomes a problem, an asymmetrical plasma results in non-uniform coating of a substrate. At high pressure, the plasma is confined to the center of the reactor, but the newsletter states that it would be desireable to control the size and shape of the plasma, independently of pressure. In addition, higher pressures decrease the size of the plasma, lessening the deposition area. With this system, only 2 square centimeters can be coated. Furthermore, the gas flows are set before the plasma is ignited. The substrate, therefore, is not at a sufficient temperature for diamond deposition at the start of a run. In Kamo, in contrast, the hydrocarbon gas is not introduced until the temperature of the substrate is above 300° C. This temperature may be too low as well.

In addition, the substrate holders are etched by atomic hydrogen, introducing contaminants to the plasma and to the substrate. If the plasma is not confined to the center of the chamber, the walls of the tube are probably etched as well. Finally, many of the deposition parameters are linked. For example, the position of the plasma is controlled by varying the pressure.

A further apparent problem could be presented by the microwave generator, which emits a pulsed signal. During off cycles, the plasma is not being energized. This could interfere with the maintenance of the plasma, or allow the recombination of activated species.

Also described in the DRMC Newsletter, at pages 5–6, is a plasma assisted CVD system being developed by Applied Science and Technology, Inc. (ASTEX), which utilizes a bell jar to contain a plasma at low pressure within a resonant cylindrical waveguide. The system has limited tunability, providing some improvement over the open tube apparatus discussed above. A rectangular waveguide conveys microwave energy emitted by a continuous, 2.45 GHz generator to a cylindrical waveguide through a tuneable antenna. The rectangular waveguide can be tuned to change its mode and the antenna can be tuned to match impedances. The newsletter states that the applicator should be able to create a ball shaped plasma with a diameter up to 150 millimeters ("mm") and a height of about 200 mm, using a well defined plasma mode. It is stated that the position of the plasma can be controlled so that it does not come in contact with the walls of the bell jar, minimizing etching. Considering the size of the plasma, a relatively small surface is coated. This suggests that the system is inefficient. The applicator may be able to create a large plasma, however, the size of the plasma is not effectively used. While a large diameter allows larger surfaces to be coated, a large height has no apparent advantage. Such a large plasma is not necessary and wastes energy. This configuration also suggests that the microwave energy is not being effectively focused, implying that the tunability is limited.

In U.S. Pat. Nos. 4,507,588 ('558), 4,630,566, ('566), 4,585,668 ('668) to Asmussen et al., and U.S. Pat. No. 4,591,662, to Roppel et al., incorporated herein by reference, an improved ion generating apparatus and a method for treating surfaces is disclosed. The device includes provisions for tuning a microwave cavity by varying both its height and the depth of insertion of an adjustable excitation probe, to minimize reflected power and adjust the mode coupling. An electrically insulated plasma defining chamber, in the form of a quartz dish is used to contain the working gas at low pressure and produce a disk-like plasma within the microwave cavity. The working gas is injected into the chamber through a radial pipe. An ion attracting means adjacent the insulated chamber attracts ions from the plasma. A steel grid below the chamber provides a surface to reflect microwave energy. The properties of the plasma, such as its shape, position, density and electric field shape, are controlled by varying the input power, pressure, the height of the cavity and the position of the probe.

In the '566 patent, improvements are made to the apparatus to adapt it for use in etching, texturing, depositing or oxidizing a surface, such as an integrated circuit. For example, a platform for supporting an integrated circuit within the insulated chamber including the ion attracting means, is added. The diameter of the insulated chamber is also increased to accommodate a larger plasma for treating multiple surfaces. Also shown is a remote mode where ions are deposited outside of the insulated chamber. In addition, magnetic field coils can be placed around the cavity to produce a longitudinal electron cyclotron resonant magnetic field in the plasma. A multipolar magnetic field can be applied to reduce diffusion losses at low pressure. This can be particularly useful in remote mode deposition, outside of the insulating chamber.

The 566 patent also discloses a method for using the device to treat a surface including the steps of providing a tuneable ion generating apparatus which includes an electrically insulated chamber, forming a disk shared plasma in the chamber with a surface positioned to receive the ions in the plasma, and contacting the surface with the ions of the plasma. The method can additionally include attracting the ions to the surface with a biasing means.

The '668 patent states that a 10 centimeter ("cm") diameter plasma disk was maintained in a 17.8 cm diameter reactor at pressures between $10^{-4}$ torr to over 1 atmosphere, with inert gases, $O_2$, $H_2$ and gas mixtures. Input power varied between tens of watts to over 1,000, with less than 3% of the incident power being reflected. Silicon wafers were oxidized and the patent states that the method and device can also be used for thin film processing such as silicon deposition.

SUMMARY OF THE INVENTION

In accordance with the present invention, this is disclosed a process for depositing diamond film on the surface of a substrate utilizing a microwave plasma generating apparatus having a tunable microwave cavity. The height of the cavity and the depth of insertion of an antenna are continuously adjustable to minimize reflected power and vary the shape and position of a plasma. The cavity also includes an electrically insulated chamber physically isolated from the remainder of the cavity, which includes a gas supply means for injecting gases into the chamber and a platform for supporting a substrate within the chamber. In using the apparatus in the process of the invention, the pressure within the chamber is first reduced. Then a plasma is created including hydrogen gas within the chamber. The pressure within the chamber should be at least 30 torr, and is preferably between 30–35 torr. The tuning of the cavity and the position of the substrate is varied to form the plasma into the shape of a disk, positioned such that the plasma is centered over the substrate, in with its surface. The substrate is heated to between about 800° C.–1,200° C. preferably 950° C.–1,100° C., and a hydrocarbon gas is injected into the plasma. The plasma is maintained for a sufficient time for a diamond film of the desired thickness to be deposited. The preferred hydrocarbon is methane, which is injected at a preferred concentration of between 0.5–2.5% of the injected hydrogen.

DESCRIPTION OF THE FIGURES

FIG. 20 is an x-ray diffraction pattern of the substrate coated in Example 10.

DETAILED DESCRIPTION OF THE INVENTION

Figure 1:
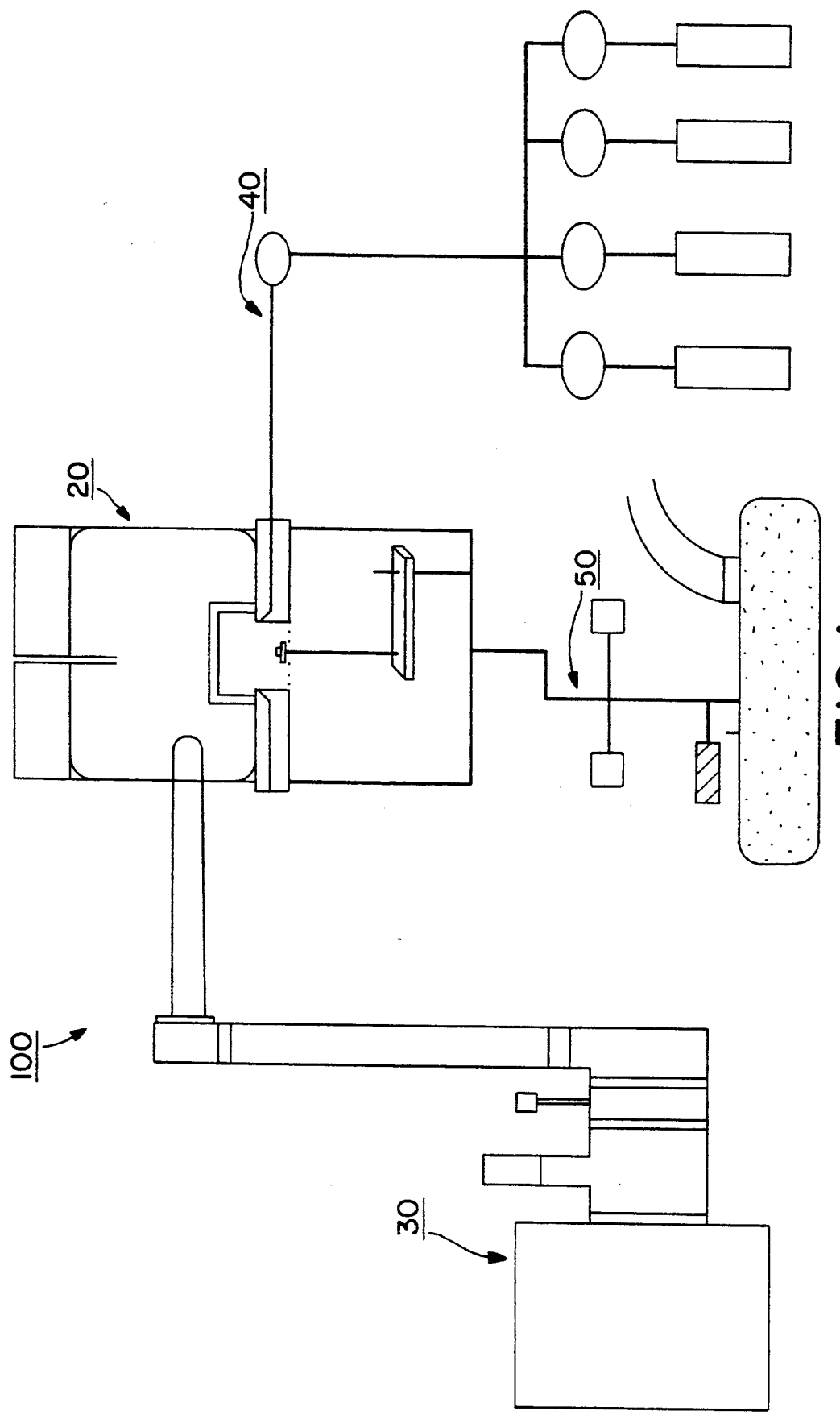
FIG. 1 is a schematic diagram of the microwave plasma chemical vapor deposition system used in the present invention.

As shown in FIG. 1, the microwave plasma chemical vapor deposition system (MPCVD) used in the process of the present invention comprises a microwave plasma reactor 20, a microwave generator system 30, a gas supply 40 and a pressure control vacuum system 50.

Figure 2A:
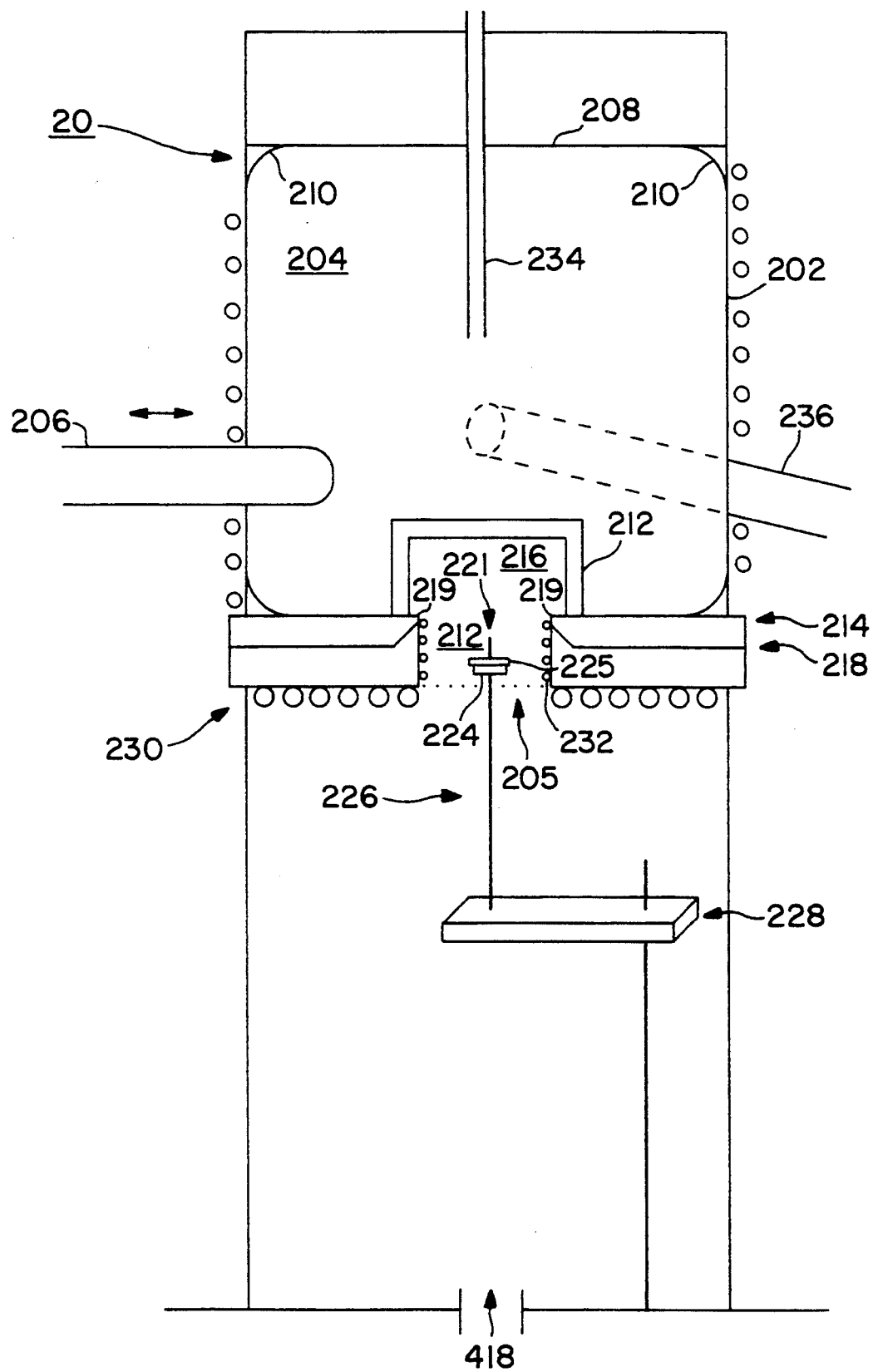
FIG. 2a is a cross-sectional view of the tuneable microwave plasma reactor used in the process of the present invention.

MPCVD reactor 20 in the illustrated embodiment, shown in further detail in FIG. 2a, consists of the brass cylindrical wall 202, with a height of 23.81 cm and a diameter of 18.42 cm. An adjustable excitation probe 206 penetrates the cavity through the wall 202 emits microwave energy from the microwave generator system 30 to the reactor 20. In the Illustrated embodiment, probe 206 is a coaxial antenna made of brass. It can also be made of copper, or other suitable metals. A sliding short 208 with conductive brushes 210 contacts the walls 202 and defines the upper wall of the cavity 204. A perforated steel grid 205, which can reflect microwave energy, defines the lower boundary of the cavity 204. The vertical adjustment of the sliding short 208 varies the electrical length of the cavity 204, changing the mode of the electromagnetic standing wave pattern of the cavity, while the penetration of the antenna 206 into the cavity 204 matches the impedance between the cavity and the generator system 30. In addition, varying the mode of the cavity controls the position and shape of the plasma.

A quartz bell jar 212, which is preferably shaped like a petri dish and in the illustrated embodiment has a height of 4.57 cm, an inner diameter of 9.09 cm and an outer diameter of 9.96 cm, rests on the base plate 214 and keeps the working gas in the plasma cavity 216. The bell jar 212 electrically insulates and physically isolates the plasma from the remainder of the cavity 204. The base plate 214 is a brass ring with a height of 1.3 inches (3.302 cm) and a center 217 with a diameter of 3.5 inches (8.89 cm). Brass is preferred because it is easier to cool than other materials which could be used, such as steel. The bell jar 212 fits within a gasket (not shown), providing an air seal between the bell jar and the cavity 204. The plasma cavity 216 is defined by the bell jar 212, the center 217 of the base plate 214, and the steel grid 205. Gas is introduced to the plasma cavity 216 through a gas inlet 218, in the shape of an annular ring. The ring has a series of holes 219 around its circumference, for injecting gas into the chamber 216. The holes are located 0.06 inches (0.152 cm) below the top of the base plate. The radial input of the gas helps provide a symmetric plasma.

The substrate 221 provides the surface for deposition. The plasma can heat the substrate 221 directly; however, it is preferred to heat the substrate indirectly, as well through a graphite susceptor 222 on which the substrate rests. When subjected to the microwave field, the temperature of the susceptor 222 increases faster than the temperature of the substrate. The substrate 221 is therefore heated by both the susceptor and the plasma. The size of the susceptor 222 is just greater than that of the substrate. The susceptor must also be resistant to etching. While graphite, such as DFP-2 from POCO Graphite Inc., is preferred, other possible materials include metals, such as molybdenum, and ceramics which can be heated by microwaves.

A ceramic platform 224 is attached to a platform holder 226 with an adjustable feedthrough 228. The platform 224 supports the susceptor and the feedthrough adjusts its height.

Figure 2B:
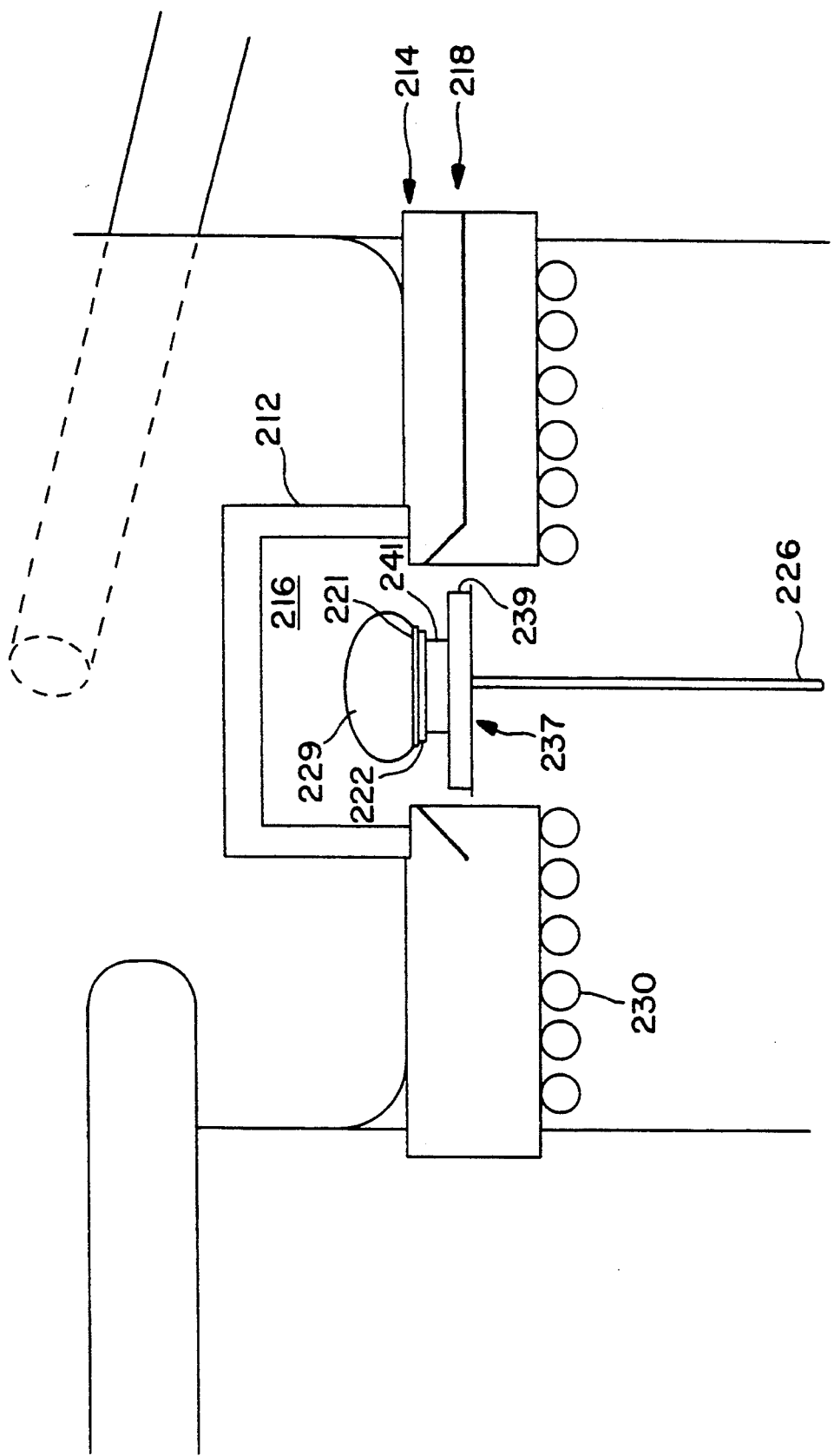
FIG. 2b is a cross-sectional view of the electrically insulated chamber of the microwave plasma reactor, showing a plasma and a steel plate for supporting the substrate.

Alternatively, FIG. 2b shows an enlarged view of the chamber 216, including a plasma 229 and a stainless steel plate 237 instead of the steel grid. The plate 237 has a diameter of 3⅜ inches (8.573 cm) and a thickness of 0.0070 inches (0.178 mm). The plate 237 is supported by the platform holder 226. Since the plate is solid, its diameter must be less than the diameter of the center 215 of the base plate 214, to allow gas to be drawn from the chamber 216, as described below. A boron nitride disc 239, available from the Carborundum Corp., at a grade of HP, with a diameter of 2.5 inches (6.35 cm) and a height of 0.115 inches (0.292 cm), is placed over the plate to provide a chemically inert barrier between the plate 237 and the substrate 221 or susceptor to prevent carbonization of the plate 237. Other chemically inert ceramics can be used. A pyrophyllite disc 241 is placed below the susceptor to position the substrate at the proper height for coupling with the plasma, and to prevent heat flow to the boron nitride and the steel plate. Pyrophyllite is a natural aluminum silicate ceramic material, which is easy to machine to a desired size. The pyrophyllite is available from Superior Technical Ceramics in the form of a large block.

To prepare the pyrophyllite 241 for use, a disk of one inch (2.54 cm) diameter, 0.286 inches (0.726 cm) height, is heated to 800° C., at a rate of 5° C. per minute, at atmospheric pressure for 2 hours. After cooling, it is heated to 1,200° C. at atmospheric pressure for ½ hour. The heat treatment changes the crystal structure of the pyrophyllite, hardening it. The heat treatment also removes water vapor and hydroxides which could contaminate plasma in the process of the present invention, described below. The pyrophyllite also becomes more resistant to etching.

The combined height of the plate 237, boron nitride 239, pyrophyllite 241, susceptor 222, and substrate 221 is such that the top of the substrate 221 is between about 0.040–0.20 inches (0.102–0.508 cm) below the top of the base plate 214. The best coupling between the plasma and the substrate takes place within this range. Better results have been obtained with the steel plate 237 than the steel grid 205. This may be due to its effect on the circulation of gas within the chamber 216.

The base plate 214 can include magnets (not shown), such as block magnets or field coils, to produce electron cyclotron resonant magnetic fields in the plasma. This enables further control of the plasma at pressures less than 1 torr. With such magnets, remote deposition can take place with the substrate located below the base plate 214, outside of the chamber 216. Remote deposition allows for larger plasmas and the coating of larger surfaces.

A heater not shown can also be used to support and heat the substrate.

Figure 2C:
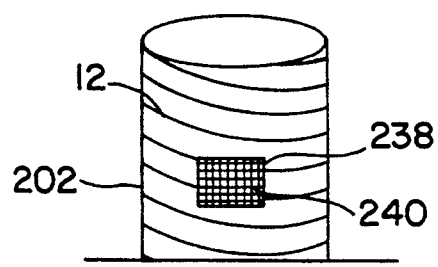
FIG. 2c is a front view of the plasma reactor.

FIG. 2c shows the outside of the cavity 204 with a quartz window 238 in the lower portion of the cylindrical wall 202, for observing the plasma and substrate. The window 238 is approximately 2 inches (95.08 cm) wide and approximately 1.5 inches (3.81 cm) high. The window is air sealed by silicone rubber (not shown), at its boundary with the brass wall 202. A copper mesh screen 240 covers the inner surface of the window, to reflect the microwave power within the cavity 234. Cooling coils 242 encircle the wall 202 of the cavity 204.

Figure 2D:
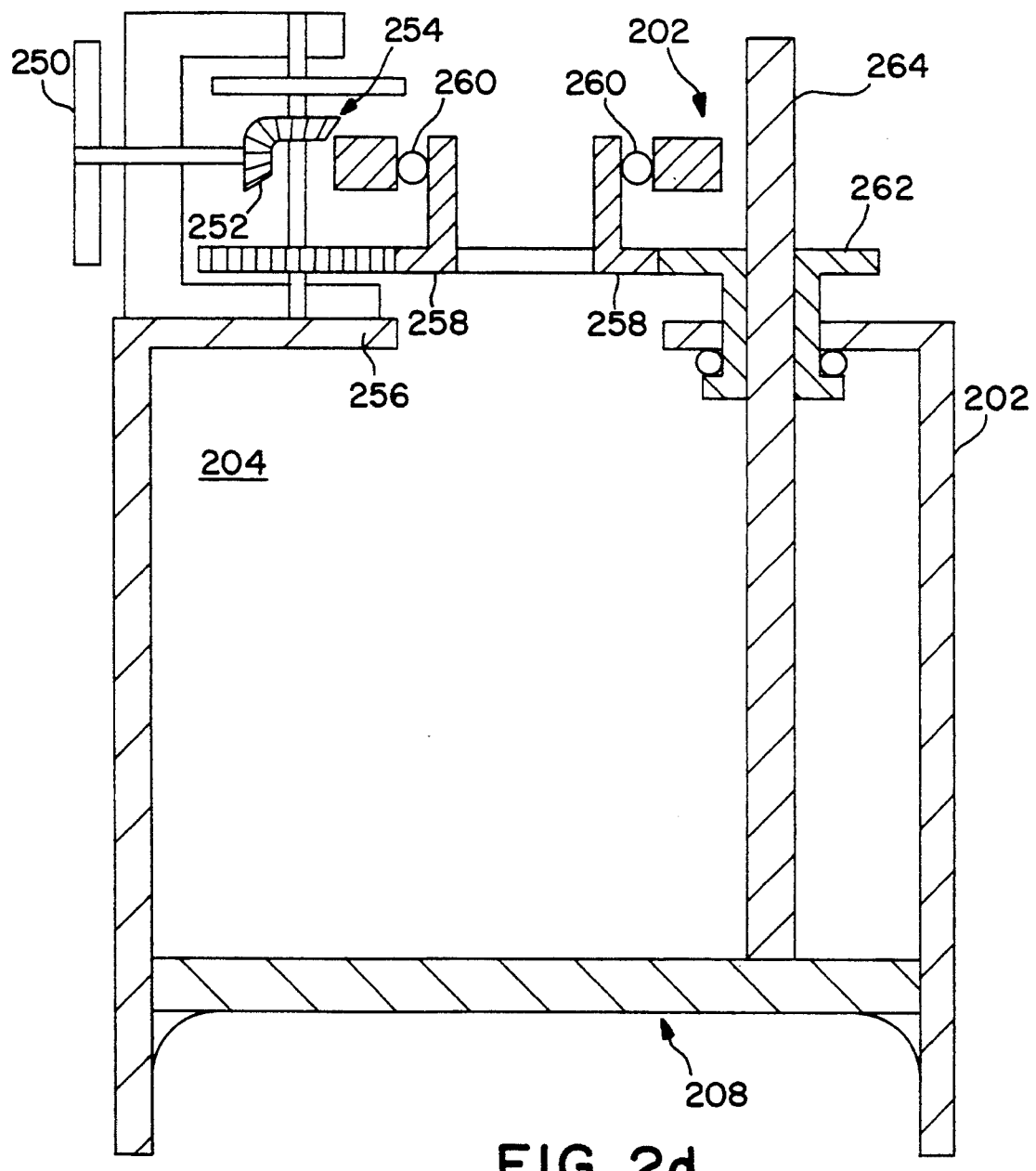
FIG. 2d is a cross-sectional view of the plasma reactor, showing the means for controlling the height of the cavity.

FIG. 2d shows how the height of the cavity is adjusted. Rotation of control knob 250 rotates gear 252 which engages gear 254. This causes spur gear 256 to rotate. Gear 256 engages central gear 258, which is secured by bearings 260 to the cavity wall 202. This rotates sleeve 262 which is also mounted on the cavity wall 202. Sleeve 202 has a threaded center for engaging jack screw 264, which is attached to the sliding short 208. Rotation of the knob 250 thereby raises or lowers the sliding short 208. A meter, not shown, indicates the height of the cavity.

Figure 2E:
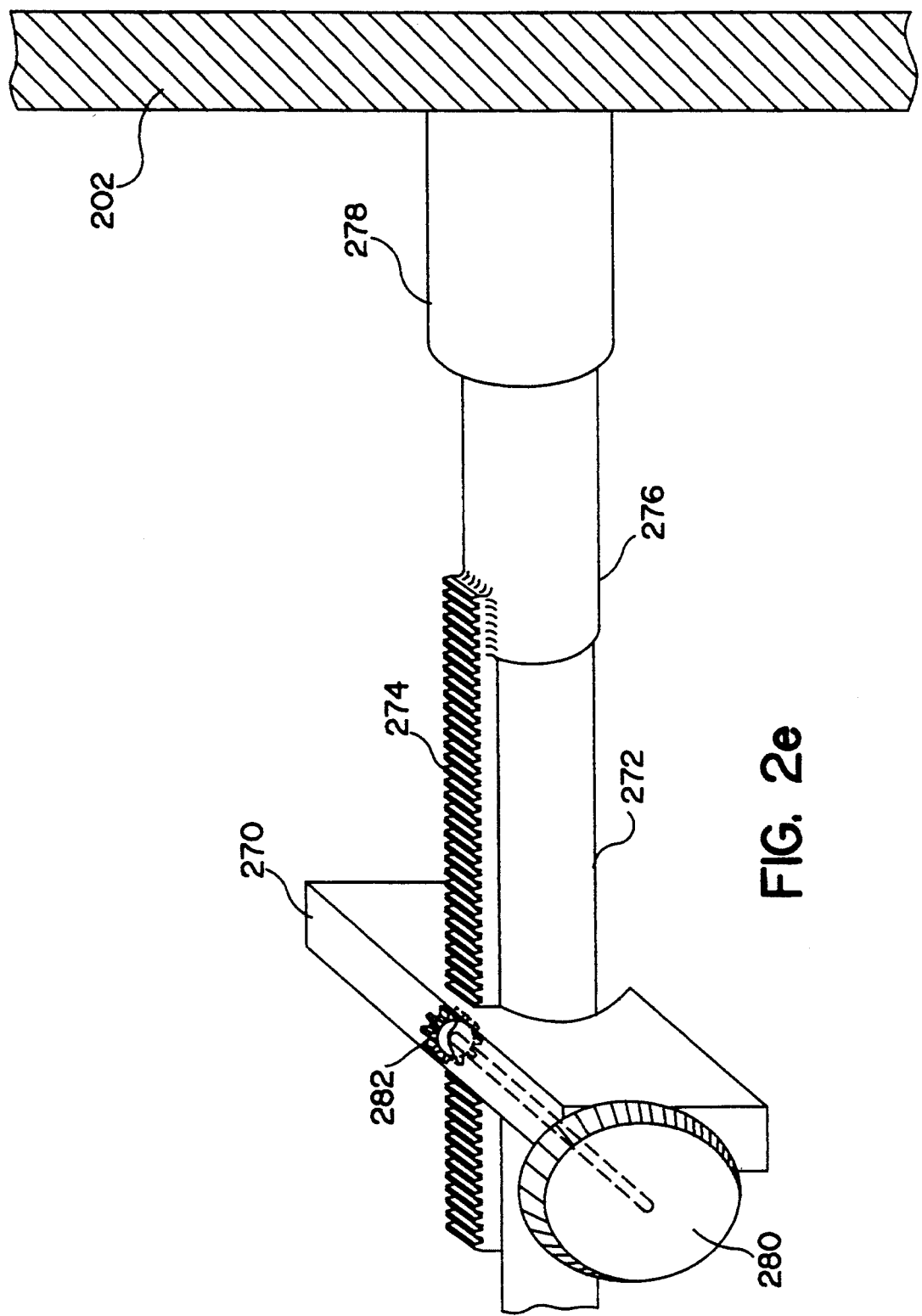
FIG. 2e is a view of the means for controlling the depth of insertion of the antenna.

FIG. 2e shows the mechanism controlling the depth of the insertion of the antenna 206 into the cavity 204. Rack and pinion system 270 overlaps a sleeve 272, outside of the antenna 206. The rack 274 attaches to a tube 276 which overlaps sleeve 272. The tube is overlapped by a second sleeve 274. The tube 276, connected to the antenna 206, can slide into and out of sleeve 278, and over sleeve 272, under the control of the pinion and rack 270. The knob 280 rotates gear 282 which pushes tube 276 into the sleeve 278, extending the antenna further into the cavity 204, or pulls it out of sleeve 278, retracting the antenna from the cavity. A meter, not shown, indicates the depth of insertion of the antenna 206.

While Asmussen's '668 patent states that the device could be used for thin film deposition, such as of silicon oxide, there was no indication that it would be suited for the deposition of high quality diamond films. Claims had been made that diamond film had been grown from a vapor at conditions below the diamond forming region, no one had been able to reliably and repeatedly deposit diamond films, and the films which had been achieved were not of high quality. Therefore, while it was known that silicon oxide is stable and therefore could be deposited at the energy levels of the Asmussen device, a similar attempt to deposit diamond would have been expected to yield graphite. Furthermore, silicon oxide has an amorphous structure similar to that of some carbons, but not similar to diamond so that Asmussen's device might have been expected to deposit an amorphous carbon film. In addition, it was not clear whether the Asmussen device could be used at the power and temperature levels required to deposit diamond.

The following changes were made to the original Asmussen device to adapt it for use in the process of the present invention.

As shown in FIG. 2a, cooling coils 230 carrying cold water are brazed onto the bottom of the base plate 214 to prevent it from overheating. Cooling coils 242 were also added to encircle the outside of wall 202, as shown in FIG. 2c. Asmussen's water cooling was inadequate for the present application.

In addition, nitrogen gas is pumped into the cavity 204 at 234 in FIG. 1 to cool the bell jar 212 and purge oxygen from the cavity, preventing ozone formation. The nitrogen is withdrawn through exhaust 236. The exhausted nitrogen is mixed with hydrogen from the pump exhaust 416, in FIG. 4, to dilute the hydrogen to below 0.5%, much below its explosive limit.

To assist in heating the substrate to the temperatures required for diamond deposition, usually between about 800° C.–1,200° C., the graphite susceptor 222 was added as a support. As discussed above, the susceptor absorbs heat from the microwave field more quickly than the substrate. As the susceptor's temperature increases, it heats the substrate.

Figure 3:
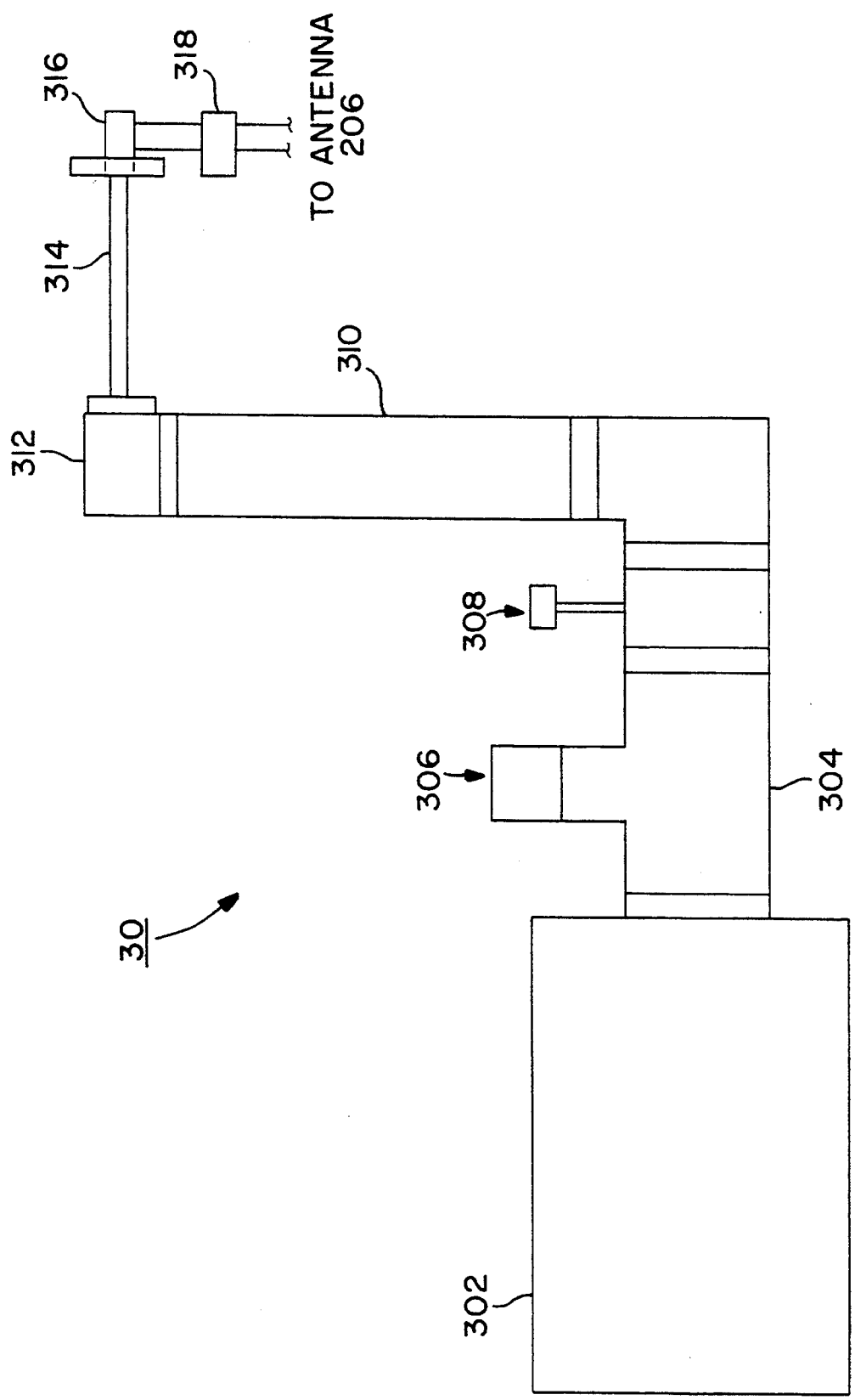
FIG. 3 is a schematic view of the microwave generator system used in the present invention.

The microwave generator system 30, shown in greater detail in FIG. 3, consists of a microwave generator 302, such as the Model GL 114 generator, available from Gerling Laboratories Industrial Systems. It has a low ripple, continuously adjustable, continuous wave power output between 0–1,500 watts at 2.45 GHz. Other similar generators can be used. A pulsed generator is not preferred because it can allow for a decrease in the energy of the plasma during its off cycle.

A three port circulator 304 prevents reflected power from returning to the generator 302 by directing it to a dummy load 306. Reflected power can damage the magnetron tube (not shown) of the generator 302, shortening its useful life. The circulator is a Model GL 401A, also supplied by Gerling Laboratories Industrial Systems. The dummy load 306, a Model GL 402, also supplied by Gerling Laboratories Industrial Systems, serves as a sink for microwave power reflected from the plasma reactor 20. Power directed to the dummy load by the circulator 304 is absorbed by water flowing in the load 306.

Dual power meters 308 are provided for reading the forward power from the generator 302 to the plasma reactor 20 and the power reflected from the plasma reactor 20. The reflected power can be minimized by tuning the reactor 10 in the manner described above.

The waveguide 314 is attached to the adjustable antenna 206 by a waveguide to coaxial coupler 316, available from Gerling Laboratories as WR 284 Model GL 316. The flange 318 secures the antenna to the coupler 316.

Figure 4:
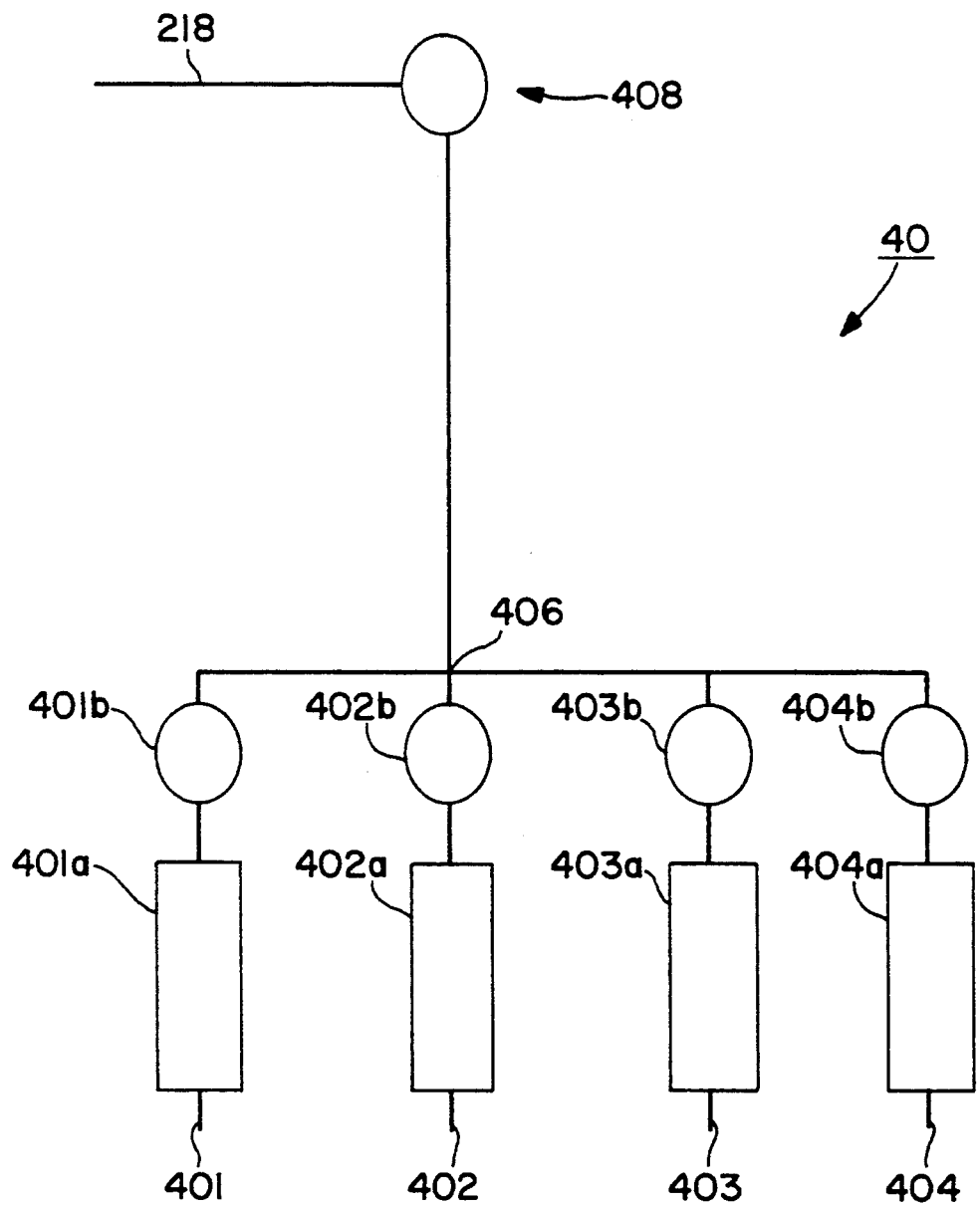
FIG. 4 is a schematic view of the gas flow system used in the present invention.

The gas supply system 40, shown in more detail in FIG. 4, provides four gas supplies, 401–404, which can contain, for example, argon, hydrogen, methane and other gases. Each line has a mass flow controller, 401a–404a. The lines combine at junction 406, and lead to a main gas inlet valve 408, which isolates the gas supply from the pressure in the chamber. Argon is used to strike the initial plasma and purge the system after the reaction. Hydrogen and methane are the active species in the formation of the diamond film. The fourth source can be water vapor or hydrochloric acid, which have reportedly improved the rate of diamond deposition, or any other useful gas.

Figure 5:
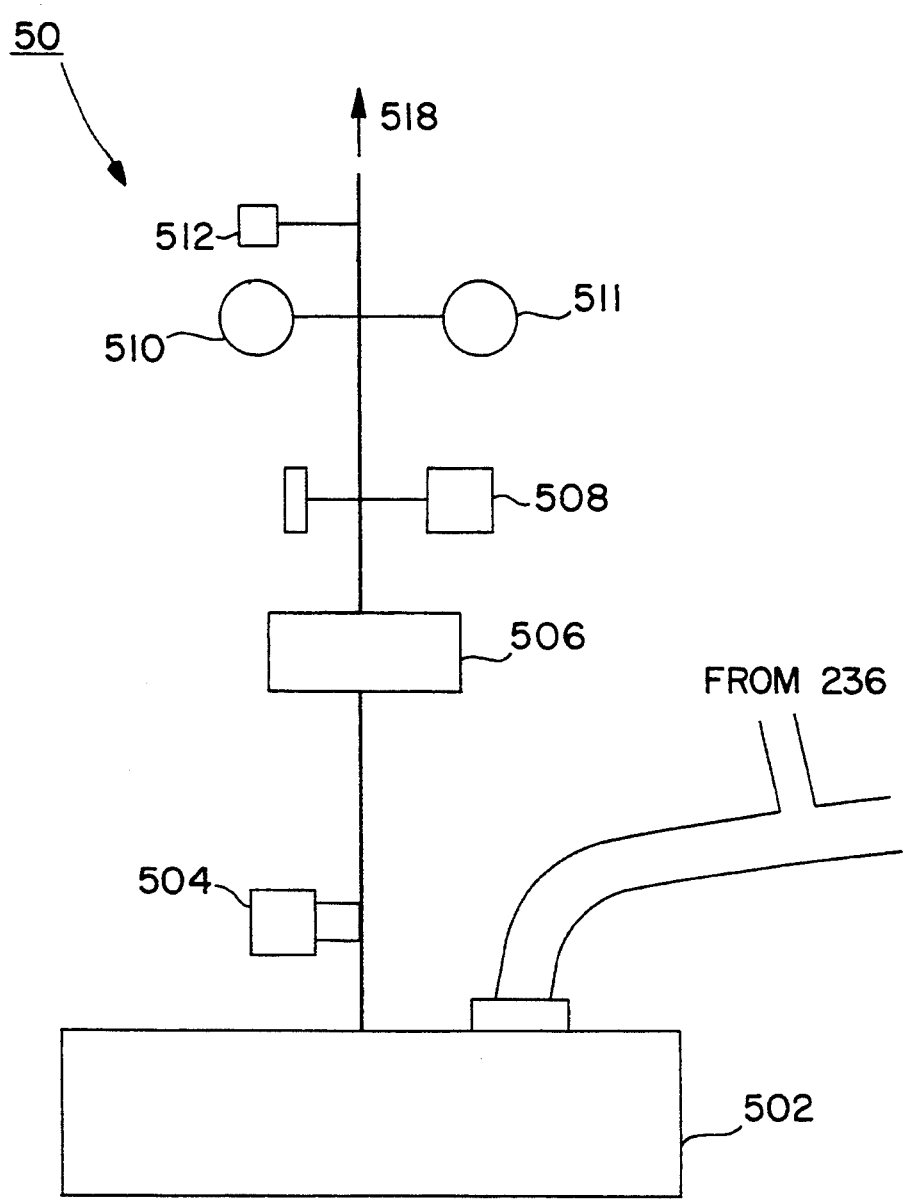
FIG. 5 is a schematic view of the pump system used in the present invention.

The pressure control and pumping system 50, shown in greater detail in FIG. 5, consists of a two stage air sealed rotary pump 502, normally capable of a 0.1 micron base pressure, and an automatic throttle valve 504 for pressure regulation to maintain a constant desired pressure in the chamber. A manual gate valve 506 isolates the pump from the chamber. This valve is usually completely open. A Televac thermocouple vacuum gage is used to determine the pressure drawn by the pump for pressures between 1–1,000 millitorr. Two Mks baratrons 510 and 511, with ranges from 0–100 torr and 100–1,000 torr, respectively, are also included for measuring higher pressures. Back to air valve 512 is used to bring the system to atmospheric pressure.

The present device, modified for use in depositing diamond, enables the maximum utilization of input energy through its precise, continuous impedance matching. Furthermore, by restricting the input gases to a confined region in proximity with the substrate, gas and energy are not wasted by the formation of plasma outside the deposition region. This increases the plasma density. Tunability allows the device to be adjusted to coat different types, sizes and shaped substrates, as well as to coat across a wide range of operating conditions. It also enables the formation of a symmetric plasma for even coating.

This device also contributes to the commercial viability of diamond deposition. By controlling so many variables, the device allows for repeatable runs. Once optimized conditions are found, the device can be set to run without further adjustment. The device is also scaleable. By lowering the frequency to 915 MHz, for example, the diameter of the cavity can be increased to 12 inches (30.48 cm) which would allow for larger plasma and increased coating surfaces. Even further expansion may be possible at lower frequencies.

In the process of the present invention, the substrate 221 is preferably polished to roughen the surface to increase nucleation sites. The best results have been obtained by applying 0.25 micron diamond paste, such as Metadi #2 from the Beuhler Co., to the substrate and holding the substrate against a silk cloth rotated by a lapping wheel for about four minutes. Diamond paste of other sizes can be used, such as paste as small as 0.1 micron or up to 1 micron. The sides of the substrate can be similarly polished. The substrate is then rinsed with acetone to remove contaminants caused by handling and is then rinsed with alcohol to remove the acetone. The substrate is kept in the alcohol to prevent contamination prior to being placed into the cavity. An automatic polisher such as an AP400 from the LECO Company, with 270 micron diamond grit, has also been used with less satisfactory results.

To position the substrate, the top portion of the microwave cavity 20, including the sliding short 208, is removed. The bell jar 215 is then removed and the substrate 224 is placed on the susceptor 222. The bell jar is then replaced. Good quality diamond film has been deposited on substrates of silicon nitride, silicon carbide, silicon and aluminum oxide. Good film has also been deposited on composite ceramics, such as Kyon 3000 Sialon from Kennametal Corp., which is believed to comprise about 80% by weight of silicon nitride, 6% aluminum oxide, 6% yttrium trioxide and 8% aluminum nitride. Another useful composite from the Greenleaf Corporation is aluminum oxide reinforced with silicon carbide whiskers. Films have also been deposited on germanium and tungsten carbide. It appears that it is more difficult to form nucleation sites on tungsten carbide, therefore, an interlayer, such as tungsten, or titanium nitride is bonded to tungsten carbide for improved deposition. The best results have been obtained so far with tungsten. Substrates with uneven surfaces, such as tool parts, can be coated as well.

The appropriate mode tuning and impedance matching of the system is set by adjusting the height of the sliding short 208 and the depth of insertion of the antenna 206. It has been found that in depositing diamond film in the plasma CVD system 10 of the dimensions listed above, the optimum position of the probe 206 is between 26.18 mm and 18.15 mm measured from the inner wall. The optimum position of the sliding short is between 5.63 cm and 4.90 cm above the base plate. The initial starting positions of the short and antenna are often 5 cm and 22 mm respectively, but as long as it is within the range stated above, the precise starting position is not critical. If a substrate greater than about 1 square inch (2.54 square centimeters) is used, the final probe depth can be as low as 15.08 mm. After the desired pressure is reached, the setting usually needs to be fine tuned as discussed below.

A vacuum of approximately $10^{-2}$ torr is created in the MPCVD system 10 through the pumping port 518. Argon, which is easily ionized, is first introduced to the bell jar to initiate the plasma. The argon, from gas supply 401a, for example, is fed into the plasma chamber 216 at a rate of approximately 0.15–0.25 slpm ("standard liters per minute"). This rate is not critical. The pressure in the plasma cavity 216 is now approximately 3 torr.

After the argon is introduced, the microwave power is turned on and gradually increased. The argon should ignite at about 100 watts. If the argon does not ignite by 200 watts, the cavity should be tuned, as described below. After the argon ignites, the flow of hydrogen from gas supply 303a is initiated, first at a rate of about 20 sccm ("standard cubic centimeters per minute") and then at the preferred rate of about 100 sccm. As the pressure inside the plasma cavity increases from about 5 to between 30–35 torr, the preferred pressure range, the power is increased from about 200 watts up to about 1,000 watts. Higher pressures such as those up to 45 torr may be required if larger areas, such as about 6 square centimeters, are being coated or higher power is being used. Even higher pressures can be used, but are not necessary with the present apparatus.

The power must be sufficient to heat the substrate to an adequate temperature. To form highly crystalline diamond film, the preferred temperature range is between about 950° C.–1,100° C. Diamond film has been formed between about 800° C.–1,200° C., although film formed outside the preferred range has some more $sp^2$ bonding. The usual power range is between about 600–800 watts, depending on the size and thermal conductivity of the substrate. For example, 700 watts has heated for silicon nitride substrates having a total dimension of 0.5 inches×0.5 inches×0.2 inches (1.27 cm×1.27 cm×0.508 cm) to close to 1,000° C. A silicon substrate with a diameter of 1 inch (2.54 cm) and a thickness of 0.016 inches (0.406 mm) requires only about 600 watts to be heated to nearly 1,000° C. Aluminum oxide reinforced with silicon carbide, 0.5 inches×0.5 inches×0.25 inches (1.27 cm×1.27 cm×0.508 cm), requires 800 watts to reach the same temperature. If a heater is utilized, the power energizing the plasma can be decreased. An optical pyrometer can be used to verify the temperature. After the desired pressure is reached, the argon is turned off.

The tuning of the cavity 204 is adjusted, if necessary, based on a visual inspection of the plasma, and readings of the dual power meters 308. The surface area of the plasma which couples with the substrate should be slightly greater than the surface area of the substrate. As shown in FIG. 2b, the plasma should be centered over the substrate. If coating substrates for use in cutting tools, the plasma 229 should overlap at least about 20% of the sides of the substrate to ensure adequate coating of the edges of the substrate. This is important since the edge does most of the cutting. The bottom of the plasma 229 is somewhat cone shaped, converging on the substrate. The plasma should not contact the walls of the bell jar 212, because this could etch the quartz, transporting contaminants, such as silicon, into the plasma and onto the substrate. If after tuning the plasma is still too large, the pressure can be increased. If the plasma is too small, the pressure can be decreased. Decreasing the size of the plasma also increases its density and the rate of deposition. It could also increase the temperature of the plasma, which would increase the temperature and rate of heating of the substrate. Such changes in pressure could necessitate retuning of the cavity to minimize reflected power.

The reflected power should be less than 20 watts, and is preferably less than 10 watts. Near zero reflected power is achievable with this system and is the most preferred for efficiency and life of the generator.

Since the substrate is coupled with the plasma, substrates of different compositions or shapes could interfere with the mode coupling and impedance matching of the chamber, requiring tuning adjustments. This would be indicated by high reflected power readings, such as above 20 watts, and improper positioning of the plasma.

One commonly observed plasma configuration indicating deviations from proper tuning is where the plasma is positioned below the susceptor. In this case, to properly position the plasma, the substrate may need to be lowered by adjusting the platform feedthrough. The height of the sliding short 208 would also need to be raised. If the plasma is too high above the substrate, the short can be lowered and the substrate raised. If the plasma is contacting the sidewalls, its diameter can be decreased by increasing the pressure in the cavity. A smaller substrate should then be substituted. If the plasma is properly positioned but the reflected power is too high, the substrate can be lowered and the plasma repositioned by lowering the sliding short.

Adjustments in tuning are performed manually, as discussed above. Usually, the height of the sliding short is varied less than 2 cm from its initial position while the antenna can be varied several millimeters. Such tuning could also be done by an automatic feedback, utilizing the power meter 308.

When properly positioned, the plasma heats the substrate 221 and the graphite susceptor 222, which also heats the substrate. It takes about 10 minutes for the substrate temperature to reach the preferred temperature range, at which time a hydrocarbon gas, such as methane or acetylene from gas supply 402a is turned on, at a preferred rate between about 0.5-2.5 sccm.

It has been found that the ratio between the hydrogen and the hydrocarbon critically effects the quality of the diamond film. The more crystalline films have been deposited when the methane concentration is between about 0.5-1.5% of the concentration of hydrogen. At about 2% the film can have smaller, spherulitic type crystals, but still have favorable characteristics for many applications. As a matter of fact, early indications are that diamond film deposited at 2% methane in accordance with the present invention has better wear resistance than film made at lower concentrations. This is discussed further, below. Higher rates and rates as low as about 0.2%, are possible as well. In accordance with the present invention, a deposition rate of approximately 1.2 microns per hour is achieved. Deposition is continued until the desired thickness of film is attained.

Once tuned for a particular substrate and operating conditions, the same height and depth will be the proper tuned position for subsequent identical runs. In large scale production for commercial use, the device could be set and allowed to coat identical substrates without constant retuning. The run should be monitored, however, since random variations in gas flow or temperature, for example, could require retuning. If retuning is required, it can be easily made. After a run, when a different type of substrate is to be coated under its optimum conditions, the next run can be made after limited retuning. The use of the tuneable device to deposit diamond film is within the scope of the present invention, even if no actual retuning is performed when coating a substrate.

In an attempt to obtain better quality diamond film with a finer crystalline structure and better adherence to the surface, a 2 step coating process comprising a first nucleation step can be added prior to the standard coating procedure. After the ignition of hydrogen, the power is increased to raise the temperature of the substrate to between 800° C.–900° C. The methane is then turned on for between 1-2 hours. The low temperature deposition is believed to increase the nucleation sites on the surface of the substrate. After the nucleation step, which is preferably performed for 1 hour, the power is increased to raise the temperature for actual diamond deposition, preferably between about 950° C.–1,100° C. Usually, retuning is not required. It is believed that by increasing the nucleation sites, more crystals can be grown, yielding a finer crystalline structure. Without low temperature nucleation, the film comprises fewer, larger crystals. This process is particularly useful at methane concentrations of 2.0% and above. Film deposited with the 2 step process showed less influence of $sp^2$ bonding.

The quality of diamond film can be determined by 1) the presence of diamond as shown by Raman spectroscopy and x-ray diffraction; 2) the presence of little or no amorphous carbon, as shown by visual inspection and Raman spectroscopy; 3) the continuity of the film, as shown by examination by a scanning electron microscope ("SEM") image; and 4) the presence of faceted, as opposed to spherulitic crystal structure.

In Raman spectroscopy, the change in frequency of monochromatic light scattered by a medium is determined. When illuminated with the green light of an argon laser at either 514.5 nanometers or 488 nm, diamond has a characteristic emission at 1332 $cm^{-1}$. Graphite has a characteristic emission at about 1580 $cm^{-1}$. A limitation in the use of Raman spectroscopy to judge the quality of diamond film is due to an emission near the graphite peak, believed to be caused by the many grain boundaries in the multicrystalline film. A micro-Raman spectroscopy system, which can expose a single crystal to incident light through a microscope, can avoid this problem and yield very distinct Raman spectra for diamond. This can be deceiving, however, since such a spectrum only reflects the composition of a single crystal, not the quality of the entire film. In addition, graphite emits more efficiently than diamond. Because of this, a smaller concentration of graphite can cause a very strong emission.

A measurement of the diffraction pattern of x-rays exposed to the diamond film can also be used to determine the components of the film. Diamond diffracts x-rays at approximately 44°, 75° and 92° two-theta when irradiated by copper radiation. The presence of graphite is indicated by a peak at approximately 27°. The presence of amorphous carbon is difficult to determine by x-ray.

The presence of amorphous carbon or graphite can be visually observed since it blackens the surface of the film. Magnification with a SEM of about 200 times will be sufficient to observe whether the coating is continuous.

Finally, diamond film with a low $sp^2$ (graphitic) signal by Raman exhibits a faceted crystal structure. Diamond with significant indication of multiple bonds with sp and $sp^2$ configuration, forms a spherulitic or amorphous crystal structure. SEM magnification of about 1,000 times or more is sufficient to determine the crystal type.

EXAMPLE 1

The surface of $\frac{1}{2}$ inch$\times\frac{1}{2}$ inch$\times$0.190 inch (127 cm$\times$127 cm$\times$4.83 mm) substrate of silicon nitride ($Si_3N_4$), was roughened to increase nucleation sites by placing 1.0 micron diamond paste, available from Buehler, Ltd., on the surface of the substrate to be coated. The substrate was then placed on a silk cloth rotated by a lapping wheel and held there for four minutes. Each edge was then similarly polished. The substrate was then rinsed and left in alcohol until it was placed in the device. The bell jar of the plasma cavity of the tuneable microwave device was removed and the substrate was placed on the graphite susceptor positioned approximately 0.15 inches (3.81 mm) below the top of the base plate. The bell jar was replaced and air sealed.

The position of the sliding short was set between 5.63 cm–4.90 cm above the base plate and the antenna depth was set between 26.11 mm–18.15 mm. As stated above, the exact position of the short and antenna is not critical at this time, as long as it falls within the ranges given.

A vacuum of approximately $10^{-2}$ torr was created in the chamber beneath the bell jar by the pump. Argon was introduced at a rate between 0.10–0.15 standard liters per minute ("slpm") and the microwave power was turned on. At about 100 watts, the argon ignited, creating a plasma. The hydrogen gas was then turned on at an initial rate of 20 standard cubic centimeters per minute ("sccm"). The rate of feed of the hydrogen gas was gradually increased to 100 sccm. As the hydrogen flow rate was increased, the pressure inside the plasma cavity increased from about 5 torr to about 30 torr, at which time the argon was turned off. The power was gradually increased to 690 watts.

To minimize the reflected power and optimize the position of the plasma, the cavity height and probe depth were adjusted. Optimum tuning was achieved at a height of 5.56 cm and a depth of 20.20 mm. The plasma was centered over the substrate, which was about $\frac{1}{8}$ of an inch (3.18 mm) within the plasma. The reflected power was 10 watts. The hydrogen plasma heated the substrate to about 990° C. in about 10 minutes. The methane was then turned on at a flow rate of 0.5 sccm. After 5 hours the system was shut down. The substrate was coated to a thickness of about 6 microns.

Figure 6:
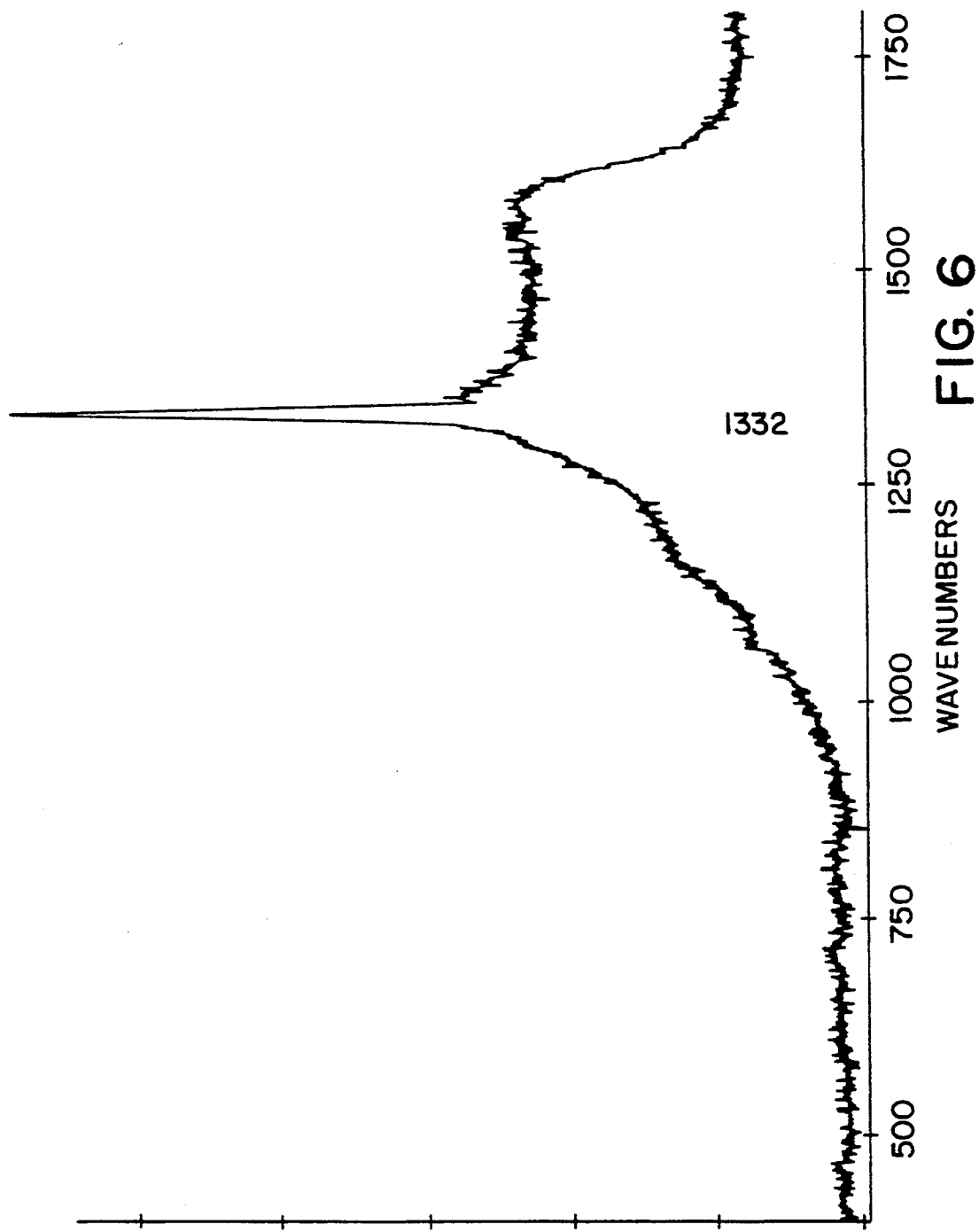
FIG. 6 is a Raman spectrum of the substrate coated as in Example 1.
Figure 7:
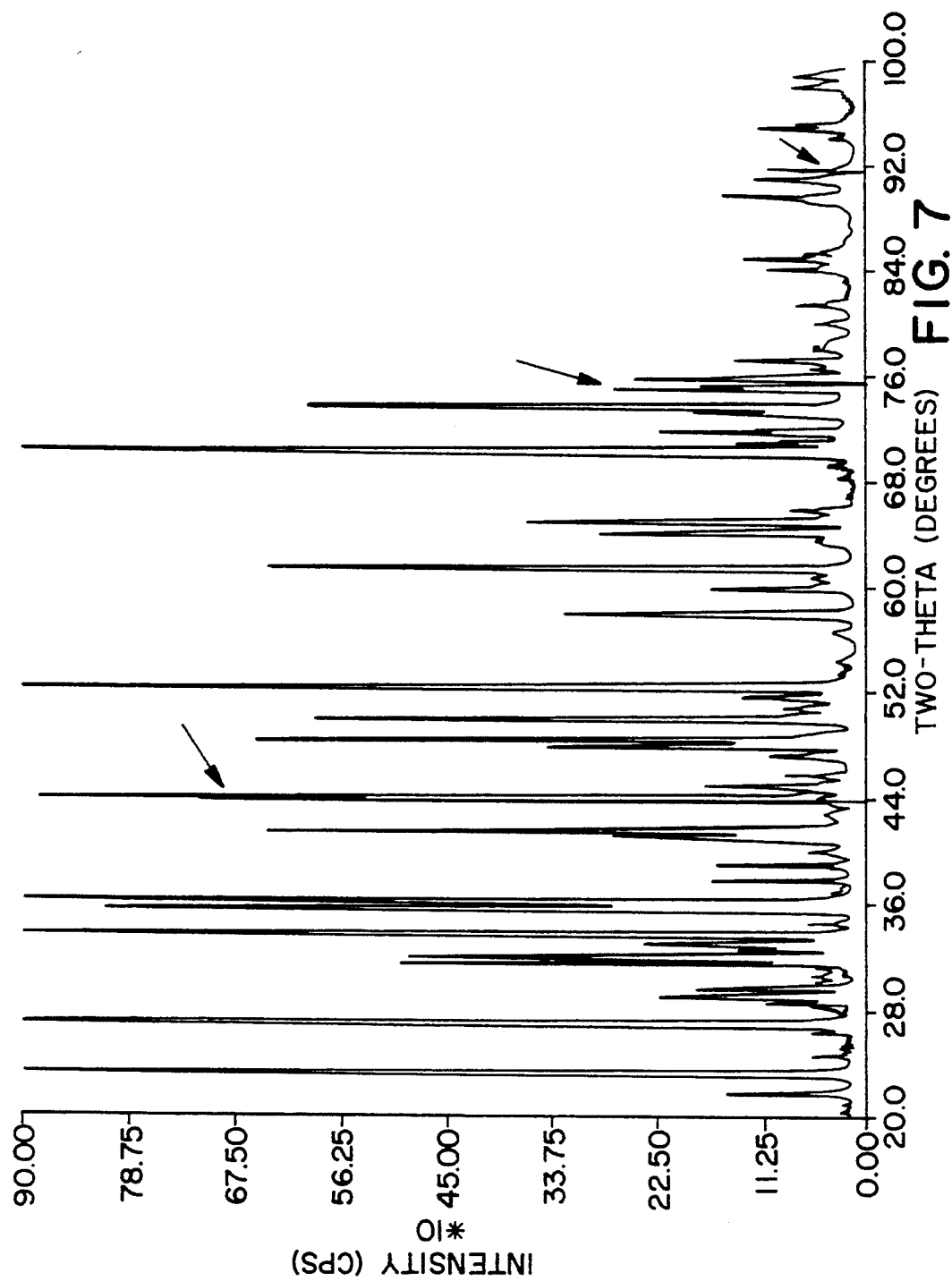
FIG. 7 is an x-ray diffraction pattern of the substrate coated in Example 1.

The Raman spectrum in FIG. 6 shows a strong diamond peak at 1332 $cm^{-1}$. The x-ray diffraction pattern in FIG. 7, also shows strong diamond peaks at about 44°, 75° and 90°. These peaks are indicated by arrows.

Figure 8A:
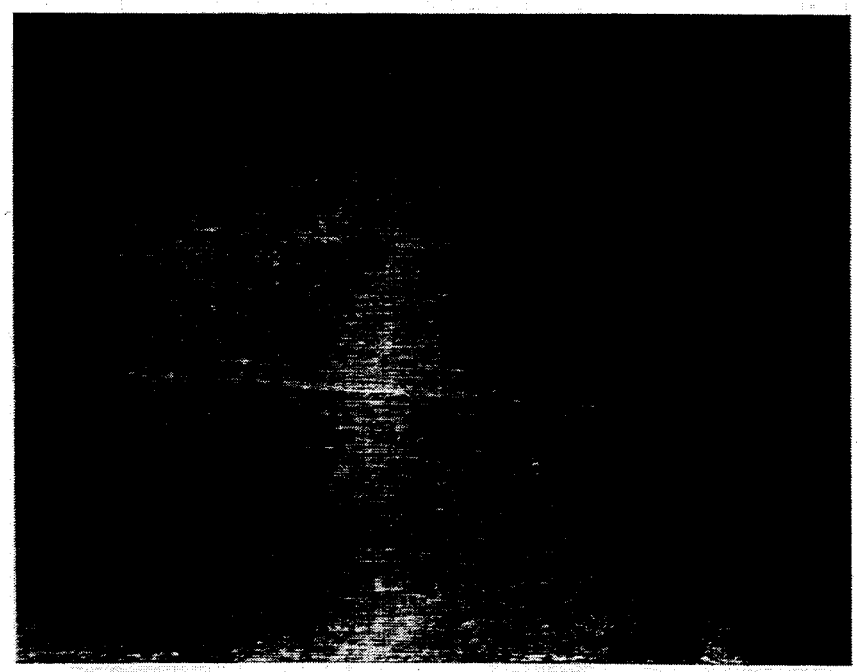
FIG. 8a is a scanning electron microscope ("SEM") image of the substrate of Example 1, magnified 200 times.
Figure 8B:
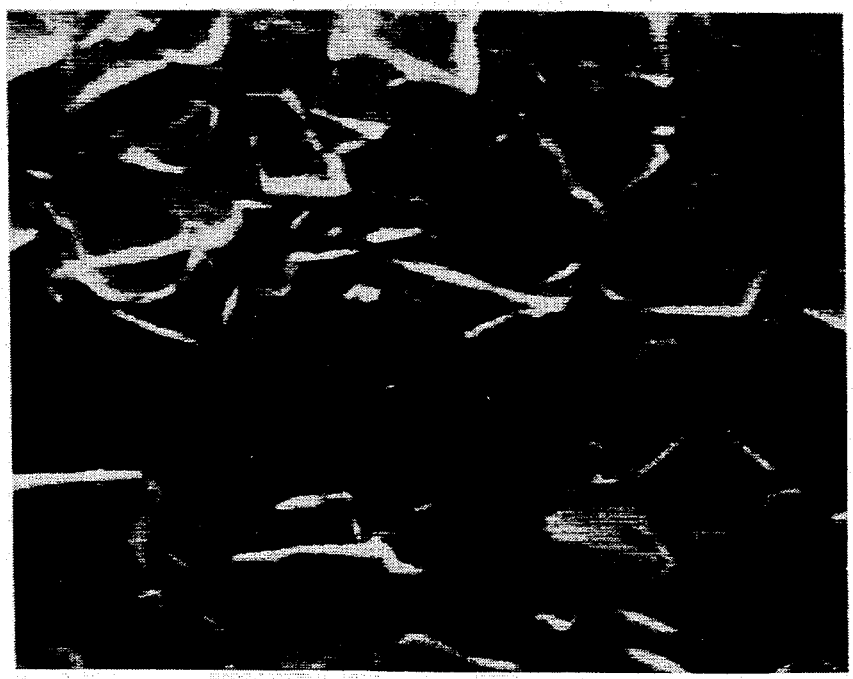
FIG. 8b is an SEM image of the substrate of Example 1, magnified 2,000 times.

The SEM image magnified 200 times in FIG. 8a shows a continuous film with uniform particle size. Magnification of 10,000 times, in FIG. 8b, shows a multifaceted crystal structure, further verifying the presence of high quality diamond film.

EXAMPLE 2

An aluminum oxide ($Al_2O_3$) substrate, with a diameter of 0.8 centimeters, and a thickness of 0.2 centimeters, was polished and coated as in Example 1, at the following conditions; hydrogen flow: 100 sccm; power: 700 watts; temperature of substrate: 990° C.; methane flow: 1.0 sccm; pressure: 30 torr. The final height of the cavity was 5.56 cm and the depth of insertion of the probe was 20.78 cm. The reflected power was 15 watts.

Figure 9:
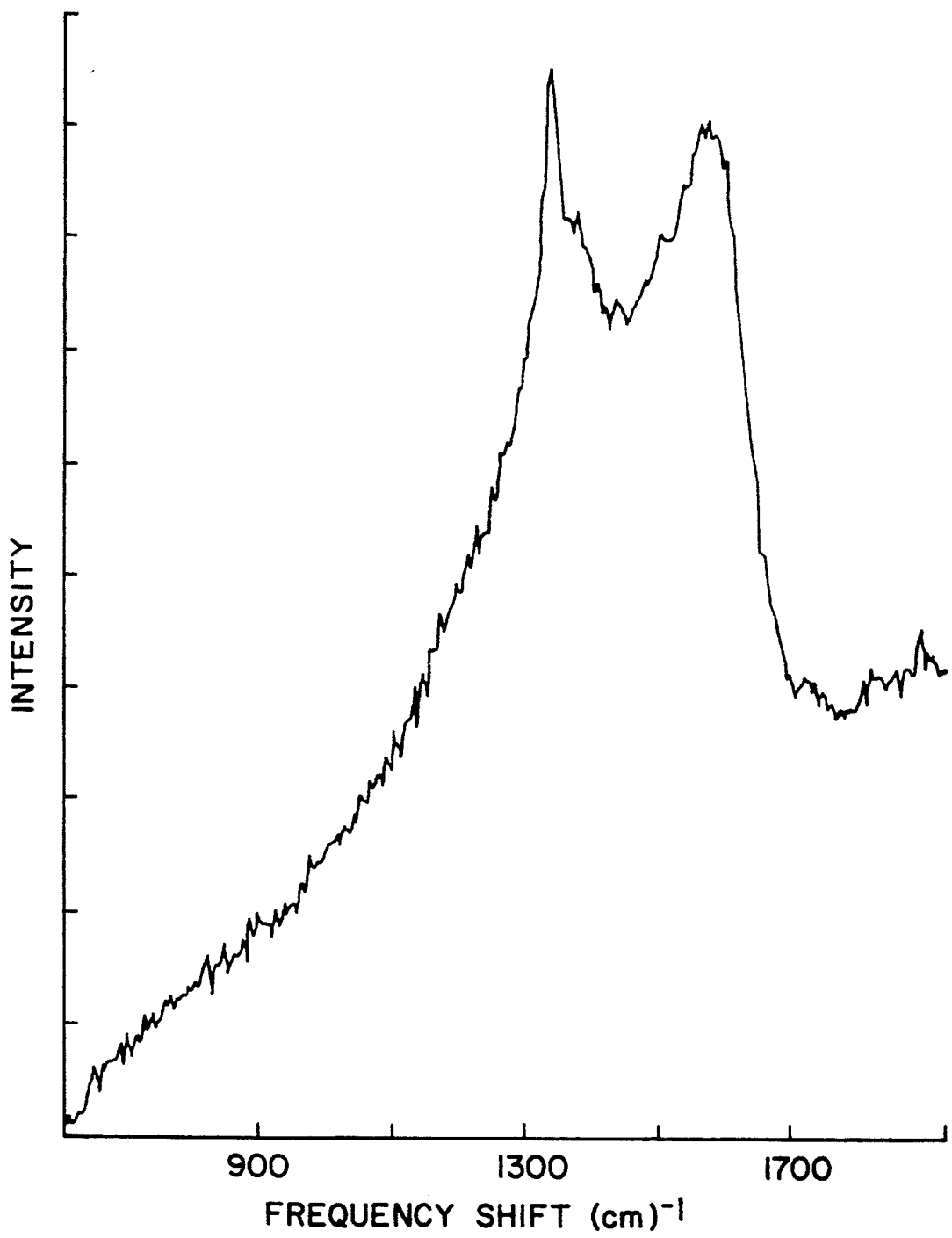
FIG. 9 is a Raman spectrum of the substrate coated in Example 2.
Figure 10:
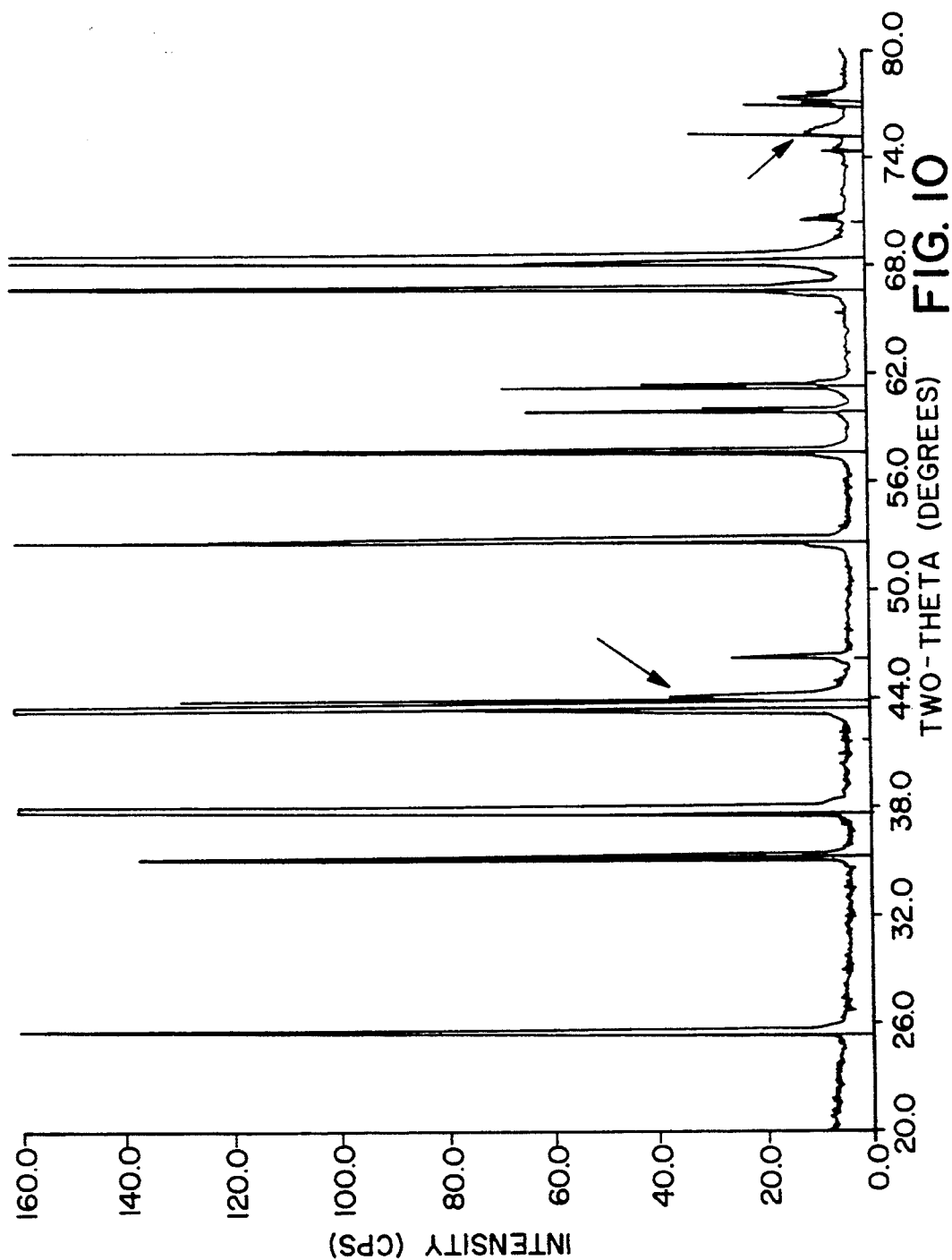
FIG. 10 is an x-ray diffraction pattern of the substrate coated in Example 2.

The Raman spectrum of FIG. 9 indicates that there is a diamond peak at about 1332 $cm^{-1}$ but also a possible graphitic peak. The multicrystalline structure of the film could also contribute to this peak. X-ray diffraction, in FIG. 10, shows the diamond peaks at 45° and 75°, indicated by arrows.

Figure 11:
FIG. 11 is a SEM image of the substrate coated as in Example 2, magnified 1,000 times.

The SEM image at 1,000 magnification in FIG. 11 shows a fully continuous coating. The nonuniform coating was probably cause by the roughness of the substrate surface and the thinness of the coating due to the short deposition time. The coating would have become more even if deposition had been conducted longer. Overall, this is considered good diamond film.

EXAMPLE 3

A substrate of Kyon 3000 Sialon from Kennametal Corp., having dimensions of 0.5 inches$\times$0.5 inches$\times$0.19 inches (1.27 cm$\times$1.27 cm$\times$4.83 mm), was polished with $\frac{1}{4}$ micron diamond paste, available as Metadi #2 from Buehler, Ltd., and rinsed with acetone, followed by alcohol. Sialon is a composite material believed to comprise about 80% by weight of silicon nitride, 6% aluminum oxide, 6% yttrium oxide and 8% aluminum nitride.

Figure 12A:
FIG. 12a is an SEM image of the substrate coated as in Example 3, magnified 200 times.
Figure 12B:
FIG. 12b is an SEM image of the substrate coated as in Example 3, magnified 10,000 times.

Coating was conducted as in Example 1 for 8 hours under the following conditions; hydrogen flow: 100 sccm; power: 740 watts; temperature: 1020° C.; methane flow: 1.0 sccm; pressure: 35 torr; reflected power: 15 watts; cavity height: 5.079 cm; probe depth: 20.325 mm. FIG. 12a shows an SEM at 200 magnification, illustrating a continuous coating. Several large multifaceted crystals can be seen, possibly due to impurities or surface irregularities. FIG. 12b shows a multifaceted crystalline structure at 10,000 magnification, indicating good diamond film. No spectra were available for this sample.

EXAMPLE 4

Silica glass, 1 inch$\times$1 inch$\times$0.025 inches (2.54 cm$\times$2.54 cm$\times$0.635 mm) was surface prepared as in Example 3 and coated in a 2 step process. Initially, the power was turned up to 500 watts, for a substrate temperature of 850° C. The hydrogen flow was 100 sccm, the methane flow was 1.0 sccm and the pressure was 35 torr. The reflected power was 20 watts, at a cavity height of 5.055 cm and a probe depth of 20.06 mm. The substrate sat on a graphite susceptor, resting on a pyrophyllite stand 0.26 inches (6.6 mm) thick, supported by a piece of boron nitride, on top of the steel plate.

Figure 13:
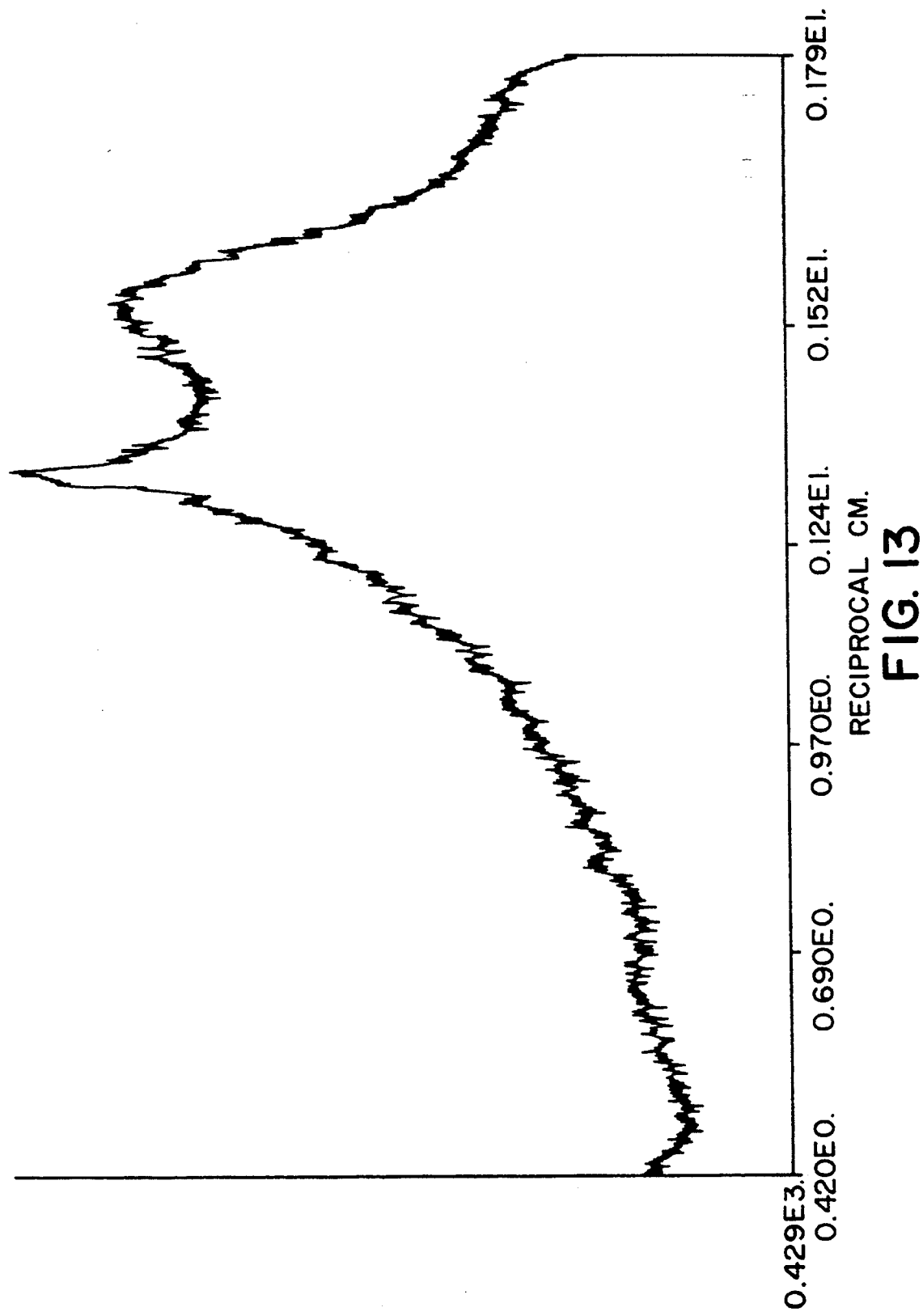
FIG. 13 is a Raman spectrum of the substrate coated in Example 4.

After 1 hour, the power was increased to 700 watts, yielding a substrate temperature of 970° C. Retuning was not necessary. Coating continued for an additional 7 hours. The Raman spectra in FIG. 13 shows a strong diamond peak.

EXAMPLE 5

A composite substrate of aluminum oxide reinforced with silicon carbide whiskers, available from Greenleaf Corporation as WG 300 and having dimensions of 0.5 inch×0.5 inch×0.19 inch (1.27 cm×1.27 cm×4.83 mm), was coated for 4 hours in a single step process, after surface preparation as in Example 3. Coating was conducted as in Example 1 under the following conditions: power: 800 watts; temperature: 1000° C.; pressure: 35 torr; hydrogen flow: 100 sccm; and methane flow: 0.5 sccm. The reflected power was 10 watts, at a cavity height of 5.0 cm and a probe depth of 20.10 mm.

Figure 14A:
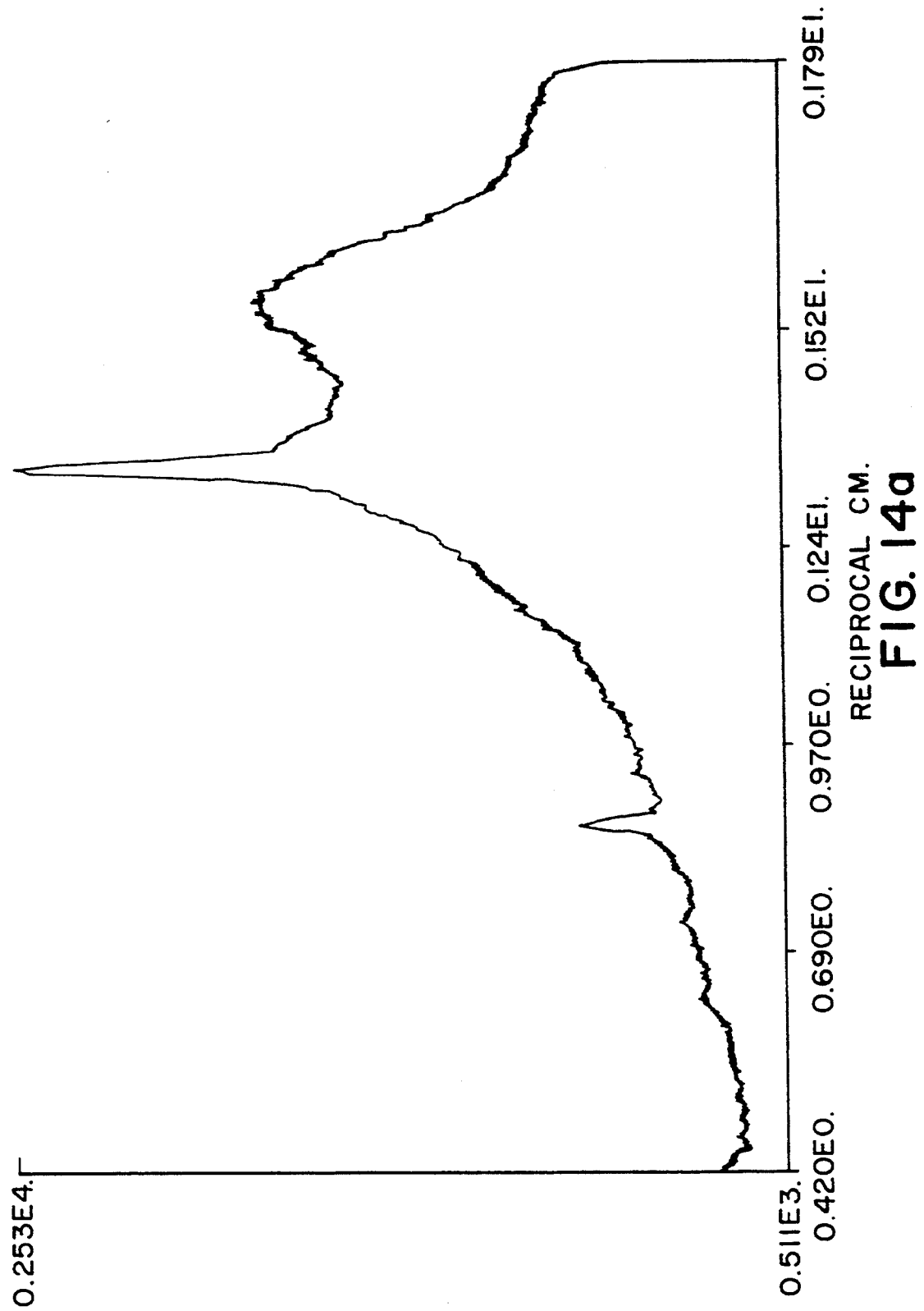
FIG. 14a is a Raman spectrum of the substrate coated in Example 5.
Figure 14B:
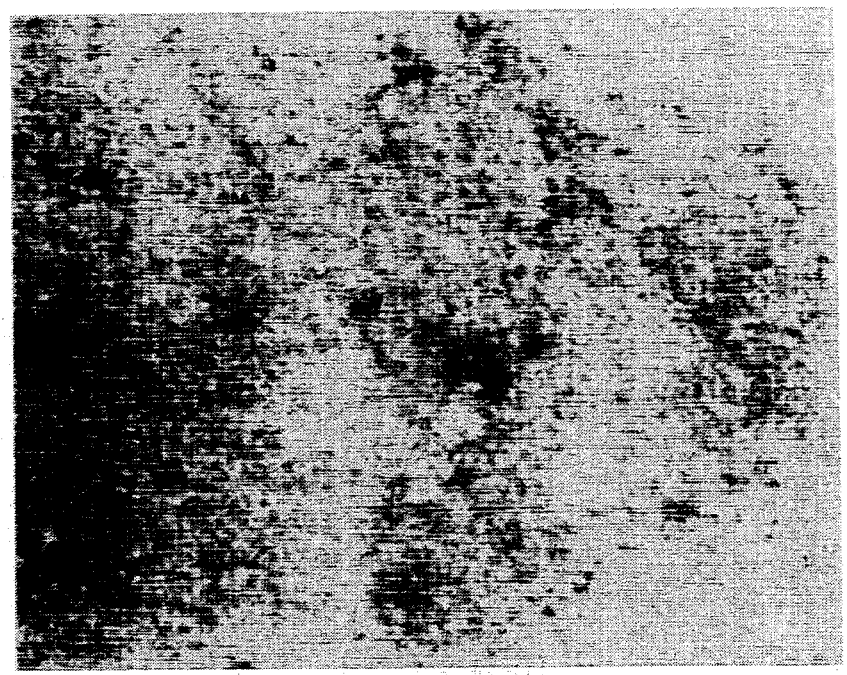
FIG. 14b is a SEM image of the substrate coated in Example 5, magnified 1,000 times.

The Raman in FIG. 14 shows a strong diamond peak. The SEM image in FIG. 14 magnified 1,000 times, shows a continuous multifaceted film.

EXAMPLE 6

Figure 15:
FIG. 15 is a SEM image of the substrate coated in Example 6, magnified 10,000 times.

Four silicon nitride substrates, each having dimensions of ½ inch×½ inch×0.19 inches (1.27 cm×1.27 cm×4.83 mm) were surface prepared as in Example 3, and coated as in Example 1, under the following conditions power: 910 watts; temperature: 960° C.; pressure 45 torr; hydrogen flow: 100 sccm; and methane flow: 0.5 sccm. The reflected power was 15 watts at a cavity height of 5.1 cm and a probe depth of 16.072 mm. The substrates were placed on a graphite susceptor in two rows of two, with less than 1/32 inch (0.79 mm) between them. After 8 hours of coating, the four substrates each showed even weight gains of 0.0024, 0.0026, 0.0026 and 0.0026 grams. The SEM image magnified 2,000 times, in FIG. 15 shows multifaceted, continuous diamond film.

EXAMPLE 7

To show that diamond film can be grown on a tungsten carbide substrate coated with interlayer of tungsten, a tungsten carbide substrate with 6% cobalt, available as TNG 432 from Greenleaf Corporation, was coated with a 12 micron layer of tungsten by chemical vapor deposition. The substrate, in the shape of an equilateral triangles with sides of 0.820 inches (2.08 cm) and a thickness of 0.191 inches (4.85 mm), was suspended in a CVD chamber at a pressure of 7 torr. The chamber was heated to 900° C. in 20 minutes and was maintained at that temperature while hydrogen was injected for cleaning the substrate and outgassing. After 30 minutes, the temperature was dropped to 700° C., and tungsten hexafluoride was injected into the chamber. After 55 minutes, the substrate was coated with about 12 microns of tungsten.

The tungsten coated substrate was surface prepared as in Example 3, and was placed directly on a pyrophyllite disc, supported by boron nitride and the steel plate. The surface of the substrate was 0.150 inches (3.8 mm) from the top of the base plate.

A 2 step coating process was conducted under the following conditions; power: 350 watts; temperature: 860° C.; pressure: 35 torr; hydrogen flow 100 sccm; and methane flow: 1.0 sccm. The reflected power was 10 watts at a cavity height of 5.070 cm and a probe depth of 21.70 mm.

After 1 hour the power was increased to 600 watts, yielding a substrate temperature of 1,000° C. Retuning was not necessary. Coating continued for an additional 7 hours.

Figure 16:
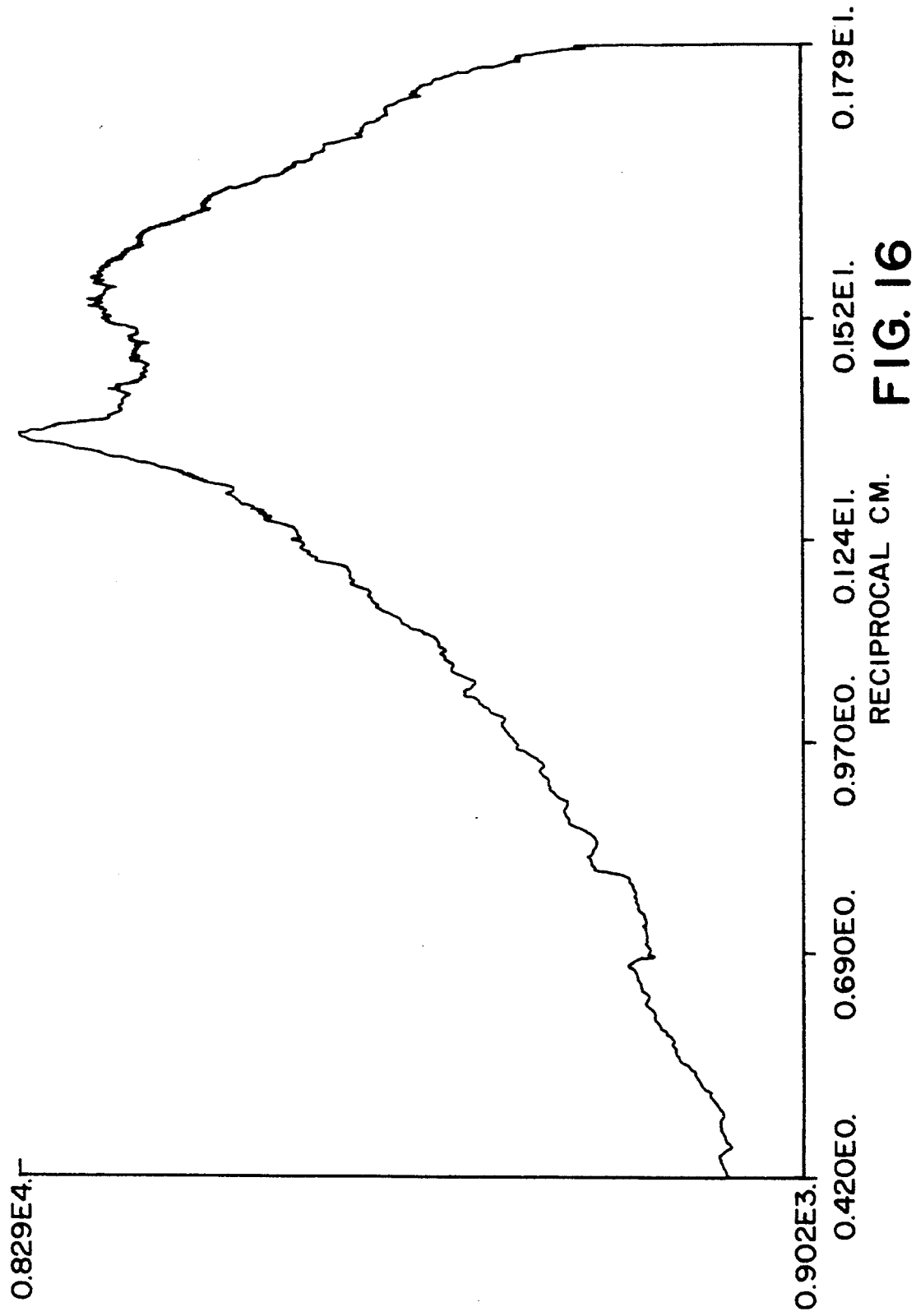
FIG. 16 is a Raman spectrum of the substrate coated in Example 7.
Figure 17:
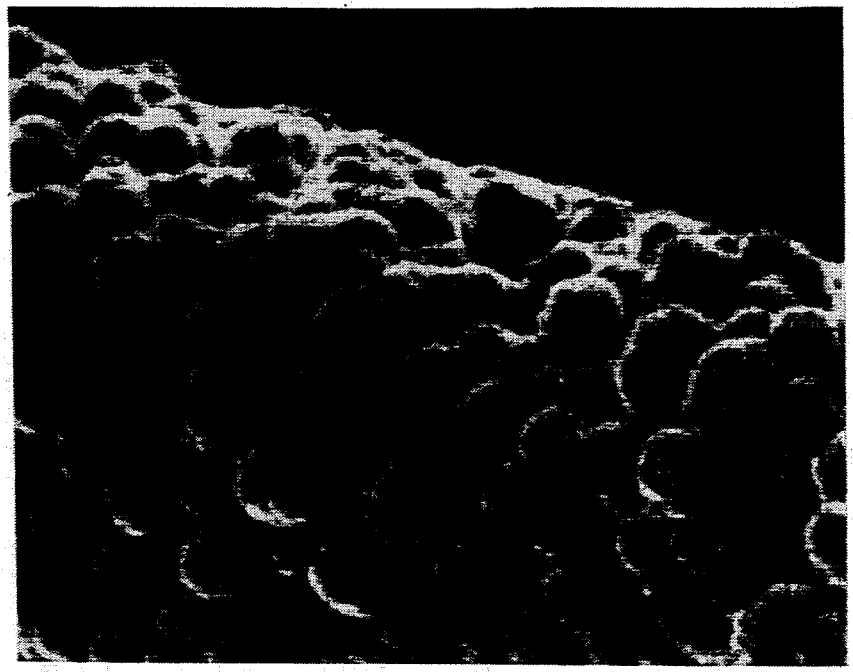
FIG. 17 is an SEM image of the substrate coated as in Example 8.

A good film was grown, having larger crystals on the edges and smaller crystals in the center. The Raman spectra in FIG. 16 shows a good diamond peak, and a secondary peak which reflects the polycrystalline structure of the film, as well as some $sp^2$ bonding.

EXAMPLE 8

To demonstrate that tool products with uneven surfaces can be coated with diamond film by the process of the present invention, a gun drill having a height of 0.535 inches (1.36 cm) was coated with a tungsten layer 10–12 microns thick, as in Example 7. The cutting surface to be coated was shaped like a triangle with one side greater than the other, having a vertex at the top of the drill. After surface preparation as in Example 3, the drill was placed on a boron nitride disc, supported by the steel plate. The tip of the gun drill was 0.270 inches (6.86 mm) from the top of the base plate.

Coating was conducted as in Example 1 for about 3 hours, at the following conditions: power: 600 watts; temperature: 1050° C.; pressure: 35 torr; hydrogen flow: 100 sccm; methane flow: 1 sccm. The reflected power was 5 watts at a cavity height of 5.025 cm and a probe depth of 20.31 mm. The plasma was centered about the tip of the gun drill, and covered the whole triangular top surface of the drill. The substrate surface coated was heated exclusively by the plasma.

To alleviate thermal stress which could cause separation between the film and the tungsten layer, the tool was cooled slowly by shutting off the methane and reducing the power to 200 watts in 15 minutes. The color of the sample changed from red to black. The power was decreased to 200 watts, and then 100 watts, before being completely shut off.

A continuous film covered the top of the drill. A SEM image magnified 1,000 times appears to show a faceted structure with some spherulitic characteristics. The Raman spectra (not shown) did not show any distinct peaks, however, this is believed to have been due to the angled shape of the surface tested.

EXAMPLE 9

A silicon nitride substrate 0.5 inches×0.5 inches×0.19 inches (1.27 cm×1.27 cm×4.83 mm) was prepared in a 2 step process. After surface preparation as in Example 3, coating for 2 hours was conducted at a power of 600 watts, a substrate temperature of 850° C., a pressure of 30 torr, a hydrogen flow of 100 sccm and a methane flow of 2.0 sccm. The reflected power was 10 watts at a cavity height of 5.0 cm and a depth of insertion of 20.00 mm.

The power was then increased to 700 watts, for a substrate temperature of 910° C. The weight gain for the substrate was 0.0042 grams.

Figure 18:
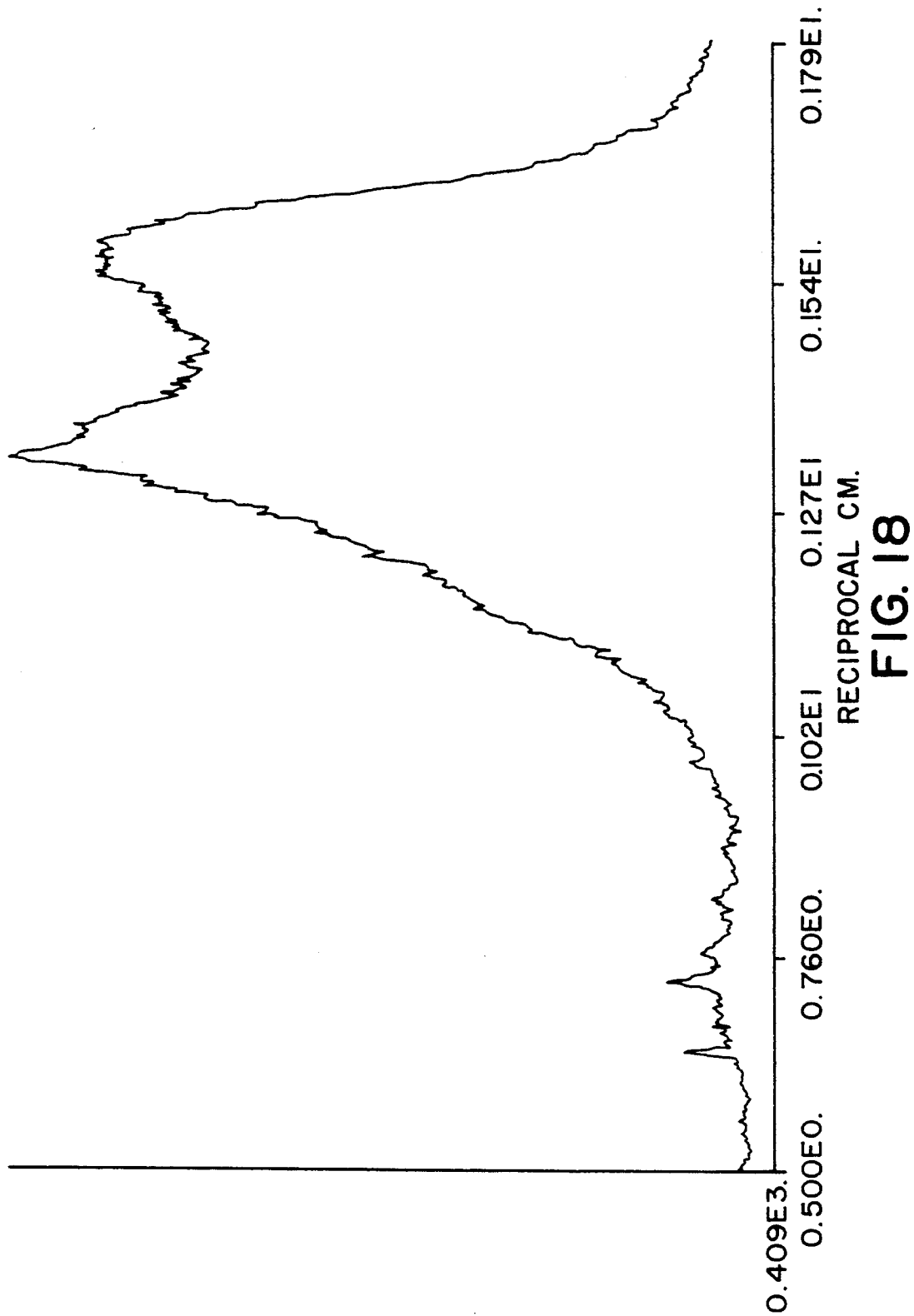
FIG. 18 is a Raman spectrum of the substrate coated in Example 9.

The Raman spectra in FIG. 18 shows a good diamond peak and a secondary graphitic peak. The SEM image (not shown) indicated a spherulitic, continuous film. The coating was grey, further indicating that there was some graphite.

EXAMPLE 10

A 0.5 inches×0.5 inches×0.19 inches (1.27 cm×1.27 cm×4.83 mm) silicon nitride substrate was first polished with an AP 400 machine, followed by lapping with 0.25 micron diamond paste. The substrate was coated as in Example 1 for 8 hours at the following conditions: power: 740 watts; temperature 1010° C.; pressure: 35 torr; hydrogen flow: 100 sccm; and methane flow 1.0 sccm. The reflected power was 10 watts at cavity height of 5.10 cm and a probe depth of 20.55 mm. The weight gain was 0.0039 grams.

Figure 21:
FIG. 21 is an SEM image of the substrate coated in Example 10, magnified 5,000 times.
Figure 19:
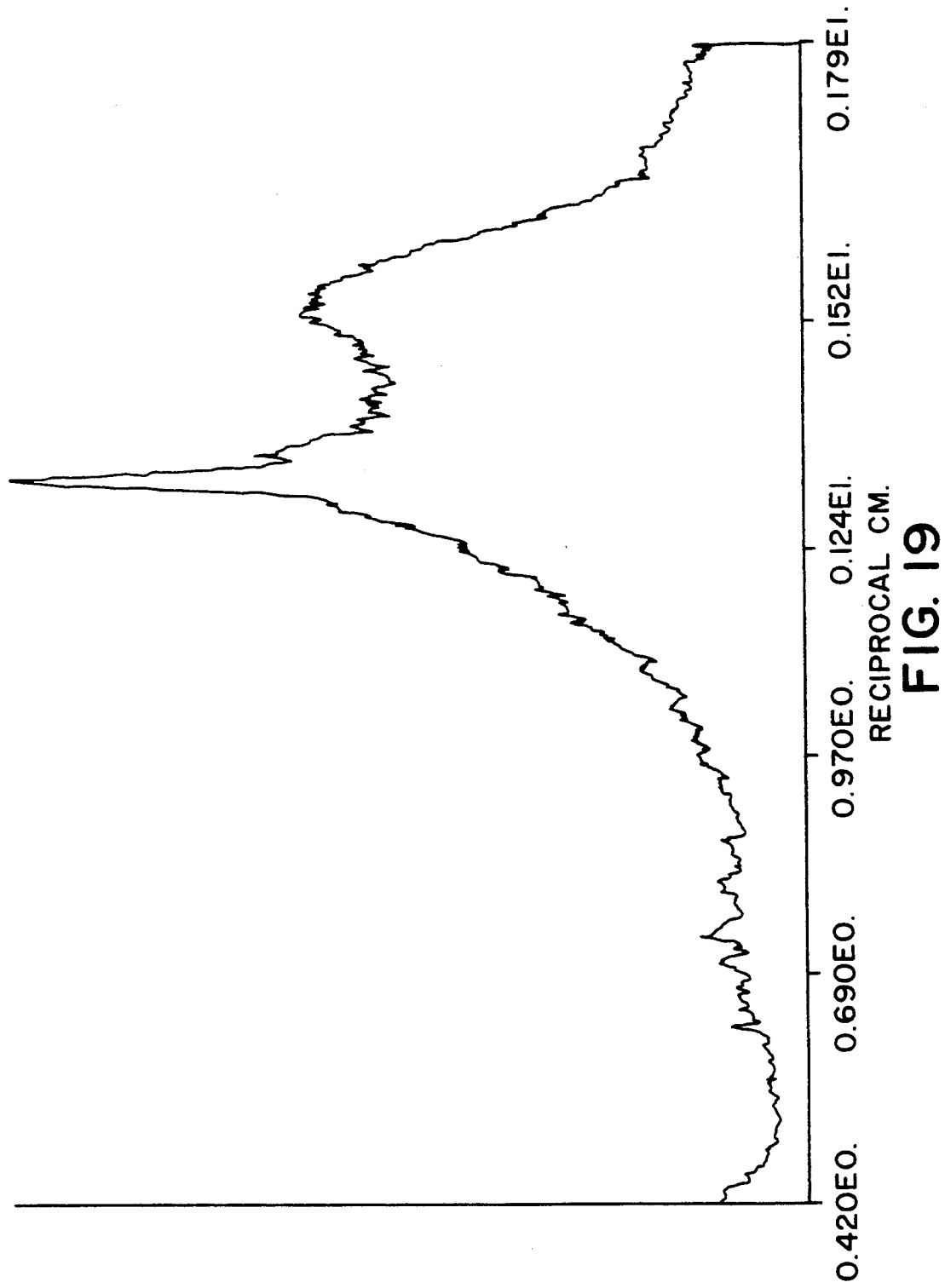
FIG. 19 is a Raman spectrum of the substrate coated in Example 10.

The Raman spectrum in FIG. 19 shows a strong diamond peak. The x-ray diffraction pattern in FIG. 20 indicates that diamond is present. SEM image at 5,000 times magnification in FIG. 21 shows a multifaceted, continuous coating.

The substrates prepared in Examples 9 and 10 were subjected to wear tests by milling 390 aluminum alloy (18% silicon). The substrates were placed in a tool holder. The cutting speed was 544 surface feet (165.81 surface meters) per minute and the aluminum moved at a feed of 0.008 inches (0.203 mm) per revolution. The depth of cut was 0.060 inches (1.524 mm). The substrate of Example 9, which had a spherulitic crystal structure and showed evidence of graphite, had a wear of 0.008 and 0.0010 inches (0.203 and 0.0254 mm). Both substrates prepared as in Example 10, which had a faceted structure and strong diamond peaks on both spectra, had significantly greater wear of 0.0040, 0.0035 and 0.0067 inches (0.1016, 0.0889 and 0.1702 mm). The substrate of Example 9 showed some chipping while one of the substrates of Example 10 showed cratering on its top surface.

Since it was expected that the higher quality diamond film would have less wear, these results are surprising. Although further tests are needed, this suggests that diamond film of a spherulitic structure has better qualities for certain applications than originally thought.

We claim:

1. A process for depositing diamond film on the surface of a substrate comprising the steps of:
    providing a microwave plasma generating apparatus including a microwave cavity tuneable by means of adjusting the height thereof and the depth of insertion of an antenna, an electrically chamber comprising insulating material within said cavity, including a gas supply for injecting gases into said chamber and a platform for supporting a substrate within said chamber;
    decreasing the pressure within said chamber;
    creating a plasma including hydrogen gas within said chamber;
    tuning said cavity to position the plasma such that it encompasses the surface of said substrate on which diamond is to be deposited;
    heating said substrate to a temperature range in which deposition of diamond can occur;
    injecting a hydrocarbon gas into said plasma; and
    maintaining said plasma for sufficient time for depositing diamond film of a desired thickness.

2. The process of claim 1 wherein said cavity has a continuously adjustable height and said tuning step comprises adjusting the height of said cavity.

3. The process of claims 1 or 2 wherein the depth of insertion of said antenna is continuously adjustable and said tuning step further comprises continuously adjusting the depth of insertion of said antenna.

4. The process of claim 1, wherein said plasma has a height less than its diameter.

5. The process of claim 1 further comprising maintaining said pressure in said cavity at at least 30 torr after creating said plasma.

6. The process of claims 1 or 5 wherein said substrate is heated to between about 950° C.–1,100° C.

7. The process of claims 1 or 5 further comprising polishing said substrate before depositing said diamond film.

8. The process of claims 1 or 5 wherein the concentration of said hydrocarbon gas is between about 0.2–2.5% of the concentration of said hydrogen gas.

9. The process of claims 1 or 5 wherein said substrate is chosen from the group consisting of silicon, silicon nitride, silicon carbide, sialon, aluminum oxide or germanium.

10. The process of claims 1 or 5 wherein said substrate comprises tungsten carbide coated with tungsten or titanium nitride.

11. The process of claims 1 or 5 wherein said substrate is supported by a graphite susceptor, pyrophyllite, boron nitride and a steel plate.

12. The process of claim 1 wherein said heating step comprises first heating said substrate to between about 800° C.–900° C. for between about 1–2 hours, and then increasing said temperature of said substrate to between about 950° C.–1,100° C.

13. A process for depositing diamond film on the surface of a substrate in a tuneable microwave cavity having an adjustable height and an antenna having an adjustable depth of insertion, and including an electrically plasma chamber comprising insulating material, said process comprising the steps of:
    decreasing the pressure in said plasma chamber;
    injecting an inert gas into said plasma chamber;
    igniting said inert gas by microwave power;
    injecting hydrogen gas into said plasma chamber;
    ceasing the injection of said inert gas after said hydrogen gas ignites;
    maintaining the pressure in said chamber at a selected level;
    positioning said plasma and tuning said cavity by adjusting the height of said cavity and the depth of insertion of said antenna for minimizing reflected power and forming said plasma such that it encompasses said surface of said substrate;
    heating said substrate to a temperature at which diamond deposition can occur;
    injecting hydrocarbon gas into said plasma;
    maintaining said plasma for a sufficient time to deposit the desired thickness of diamond film.

14. The process of claim 13 further comprising adjusting the height of said substrate.

15. The process of claim 13, further comprising roughening the surface of said substrate before coating.

16. The process of claim 15 wherein said polishing step comprises placing said substrate on a silk cloth, and rotating said silk cloth by a wheel with diamond paste between about 0.10–1 micron.

17. The process of claim 13 wherein the microwave power emitted by said antenna is between about 600–900 watts.

18. The process of claim 13, wherein said hydrocarbon is methane or acetylene, at a concentration between about 0.2–2.5% of the hydrogen concentration.

19. The process of claim 13 wherein said substrate is chosen from the group consisting of silicon, silicon nitride, silicon carbide, or sialon, alumina or germanium.

20. The process of claim 13 wherein said hydrocarbon gas is methane, at a concentration between 0.5–2.0% the concentration of the hydrogen gas.

21. The method of claim 13 further comprising heating said substrate to between about 800° C.–900° C. after positioning said plasma, injecting said hydrocarbon into said chamber, and maintaining said substrate at between about 600° C.–900° C. for about 1–2 hours, and then increasing said temperature of said substrate to between about 900° C.–1,100° C.

22. The process of claim 13 wherein said plasma overlaps at least 20% of the side of said substrate.

23. A process for coating identical substrates with diamond film in a tuneable microwave cavity having an adjustable height and an antenna having an adjustable depth of insertion, and including a plasma chamber comprising electrically insulating material, comprising the steps of
placing a first substrate in said chamber of said apparatus;
decreasing the pressure within said chamber;
creating a plasma including hydrogen gas within said chamber;
maintaining the pressure in said chamber at at least 30 torr;
selecting the tuning of said cavity and the position of said substrate to position the plasma such that said surface of said substrate lies within said plasma;
heating said substrate to a temperature sufficient for depositing the desired diamond film;
injecting a hydrocarbon gas into said plasma;
continuing said deposition for a sufficient time to deposit the desired thickness of diamond film on said substrate;
replacing said substrate with an uncoated substrate of the same type;
repeating said decreasing step, said creating step, said maintaining step, said heating step, said injecting step, said continuing step and said replacing step, until the desired number of substrates have been coated.

24. The process of claim 23 wherein said hydrocarbon gas comprises methane, at a concentration between 0.2–2.5% of the hydrogen concentration.

25. The process of claim 23 further comprising heating said substrate to between about 800° C.–1,200° C.

26. The process of claims 23 further comprising heating said substrate to between about 950° C.–1,100° C.

27. The process of claim 26 further comprising varying the tuning of said plasma to properly position said plasma by varying the height of the cavity and the depth of insertion of said antenna.

28. A process for depositing diamond film on the surface of a substrate in a tuneable microwave cavity having a continuously adjustable height and an antenna having a continuously adjustable depth of insertion, and including an plasma chamber comprising electrically insulating material, comprising the steps of:
setting said height and said depth of insertion of said tuneable microwave cavity, said setting based on said substrate and said deposition conditions;
decreasing the pressure within said chamber;
creating a plasma including hydrogen gas within said chamber at a pressure of at least about 30 torr;
heating said substrate to between 800° C.–1,200° C.;
injecting a hydrocarbon gas into said plasma; and
monitoring said plasma to ensure it is in its proper position.

29. The process of claim 28 wherein said heating step comprises heating said substrate to between about 950° C.–1,100° C.

30. The process of claim 28 wherein said hydrocarbon gas is set on a concentration between about 0.2–2.5% of the concentration of said hydrogen.

31. The process of claim 1, wherein said substrate is a tool.

32. The process of claim 1, wherein said surface of said substrate is uneven, said uneven surface lying within said plasma.

33. The process of claim 1, wherein said chamber comprising electrically insulating material comprises a quartz bell jar resting on a base plate, said base plate including cooling means for carrying fluid for cooling said base plate.

34. The process of claims 1, wherein said method further comprises pumping nitrogen gas into said cavity for cooling said bell jar.

35. The process of claim 1, wherein said substrate is placed on a graphite susceptor for supporting and heating said substrate.

* * * * *